United States Patent [19]

Okamura et al.

[11] Patent Number: 5,382,927

[45] Date of Patent: Jan. 17, 1995

[54] BAND-PASS FILTER HAVING TWO LOOPED-SHAPED ELECTRODES

[75] Inventors: Hisatake Okamura; Masahiro Kasahara; Teruhisa Tsuru; Tetsuo Taniguchi, all of Nagaokakyo, Japan

[73] Assignee: Murata Manufacturing Co., Ltd., Kyoto, Japan

[21] Appl. No.: 112,628

[22] Filed: Aug. 26, 1993

Related U.S. Application Data

[63] Continuation of Ser. No. 833,095, Feb. 10, 1992, abandoned.

[30] Foreign Application Priority Data

| Feb. 15, 1991 | [JP] | Japan | 3-021875 |
| Jun. 11, 1991 | [JP] | Japan | 3-138837 |
| Jan. 10, 1992 | [JP] | Japan | 4-021749 |
| Jan. 10, 1992 | [JP] | Japan | 4-021750 |

[51] Int. Cl.$^6$ ............................................. H03H 7/00
[52] U.S. Cl. ................................. 333/175; 333/185
[58] Field of Search ............... 333/167, 174, 175, 177, 333/178, 184, 185, 219, 204, 202

[56] References Cited

U.S. PATENT DOCUMENTS 4,894,629  1/1990  Okamura et al. ............... 333/185 X
4,918,570  4/1990  Okamura et al. ............... 333/202 X
5,105,176  4/1992  Okamura et al. ............... 333/185 X

FOREIGN PATENT DOCUMENTS 0071710  3/1991  Japan ............................... 333/185

Primary Examiner—Seungsook Ham
Attorney, Agent, or Firm—Ostrolenk, Faber, Gerb & Soffen

[57] ABSTRACT

Two coil electrode patterns are formed on one surface of a plate consisting of a dielectric material. These coil electrode patterns are formed in a loop shape, and are disposed so as to be magnetically coupled with each other. Input/output terminal patterns and earth terminal patterns are drawn out from the coil electrode patterns toward an edge portion of the plate. The input-/output terminal pattern and the earth terminal pattern of one coil electrode pattern are disposed at a selected at a distance so as to provide a predetermined impedance. An earth electrode pattern is formed opposite portion of the coil electrode patterns with the plate between them. Earth terminal patterns are formed to the earth electrode pattern. The earth terminal patterns of the earth electrode pattern are connected to the earth terminal patterns of the coil electrode patterns. A trimming electrode may be formed for adjusting the passing band frequency of the band-pass filter optionally.

15 Claims, 29 Drawing Sheets

F I G. 5
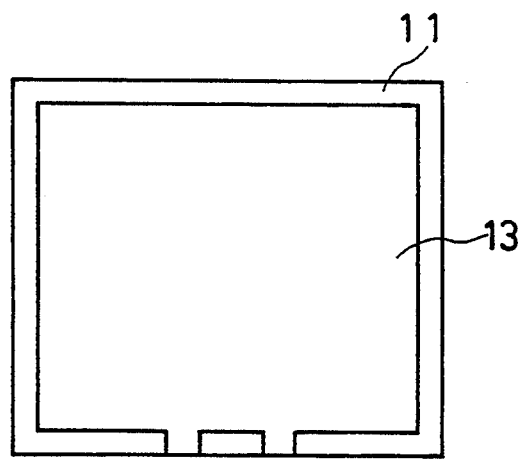
F I G. 6
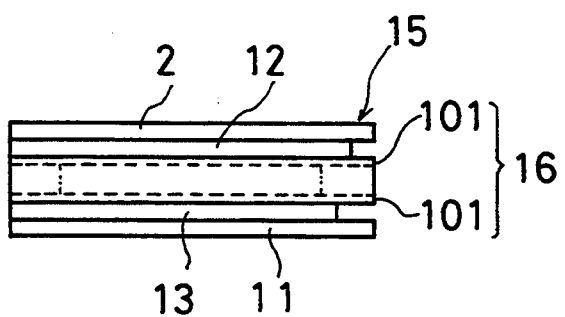
F I G. 7
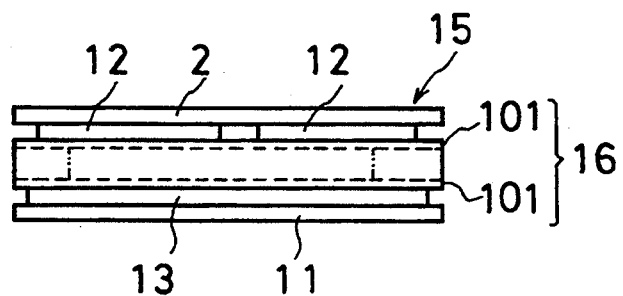

F I G. 11
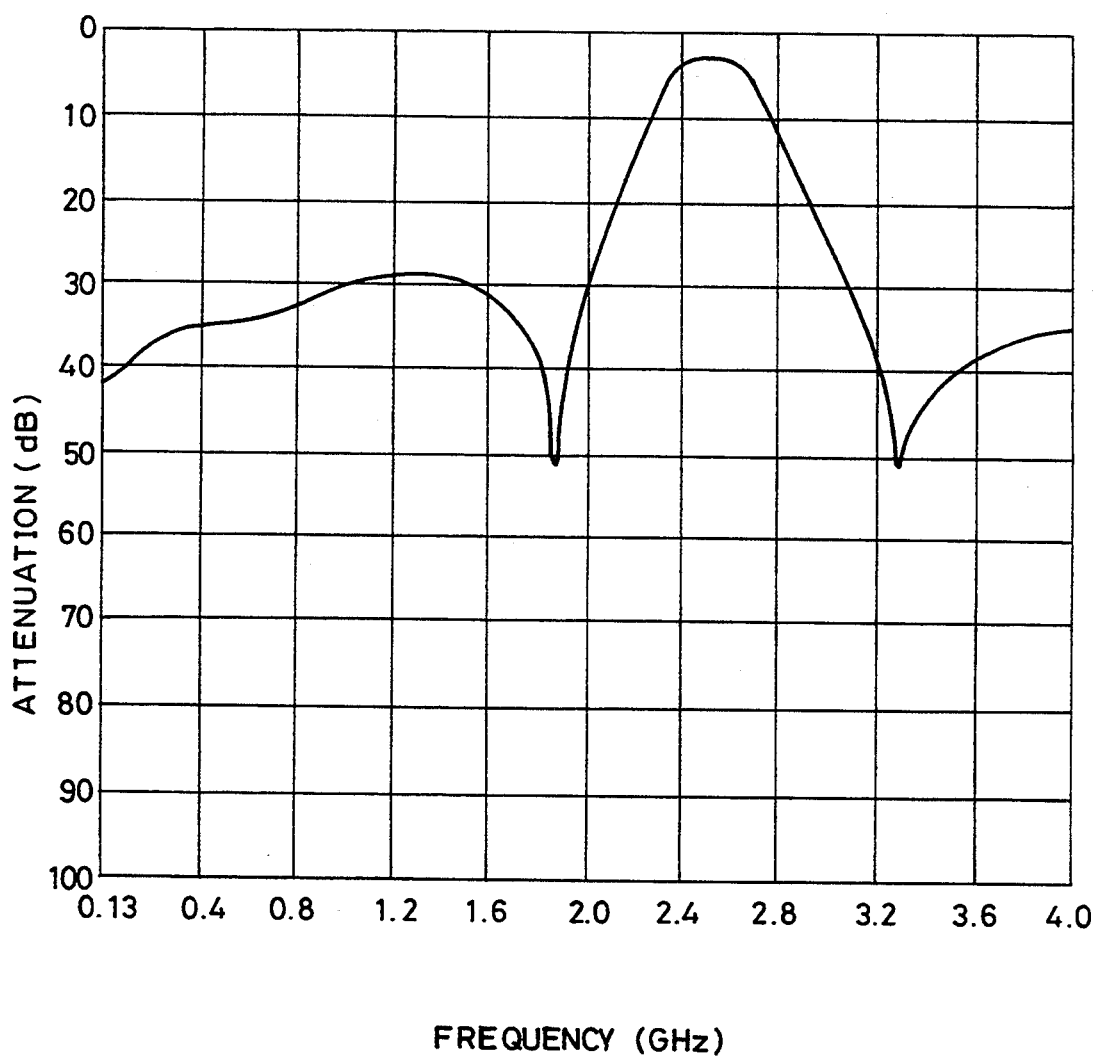

F I G.12
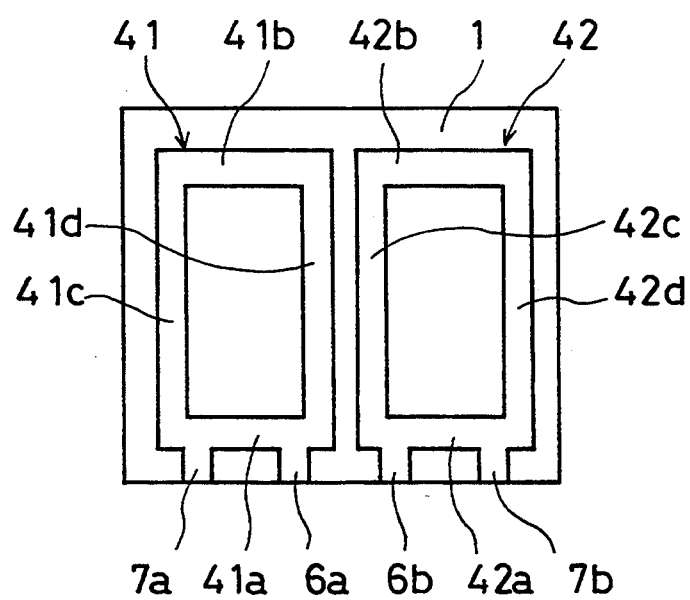

F I G.13
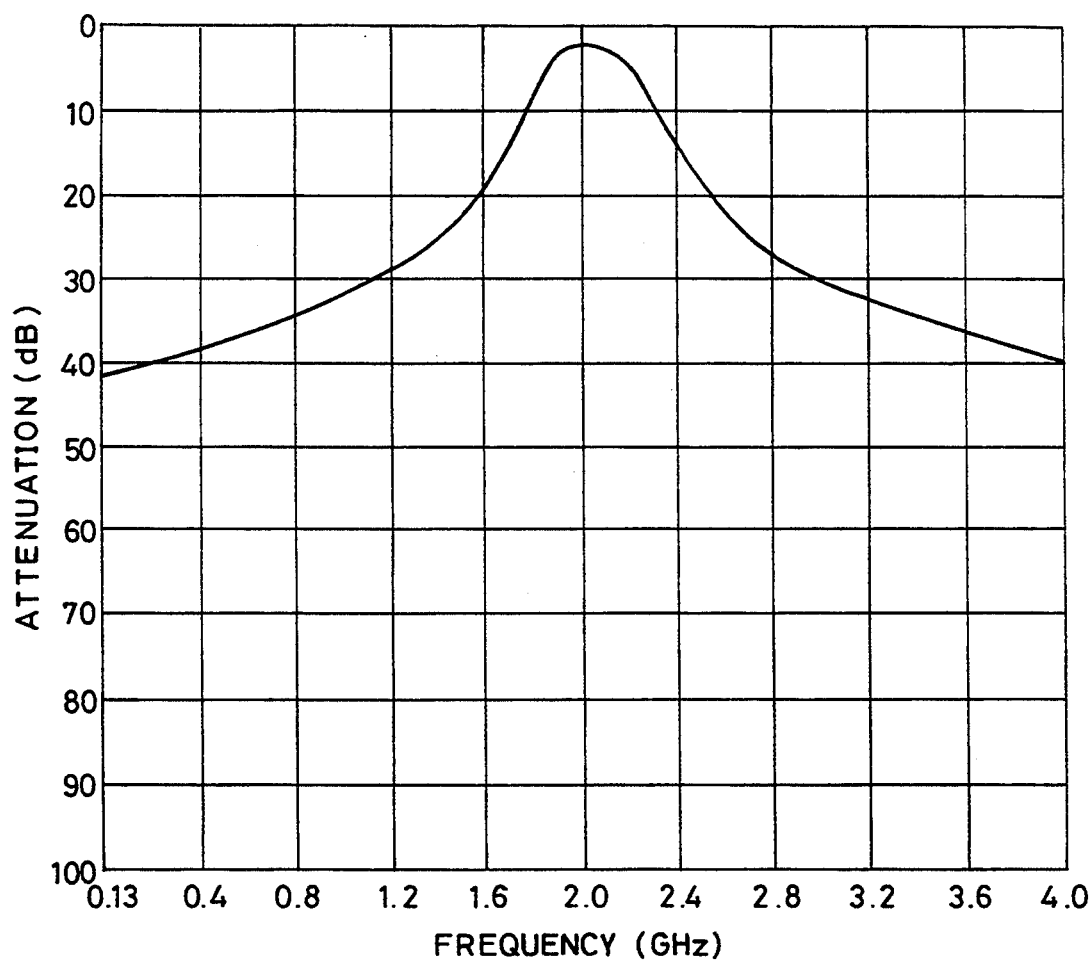

F I G.15
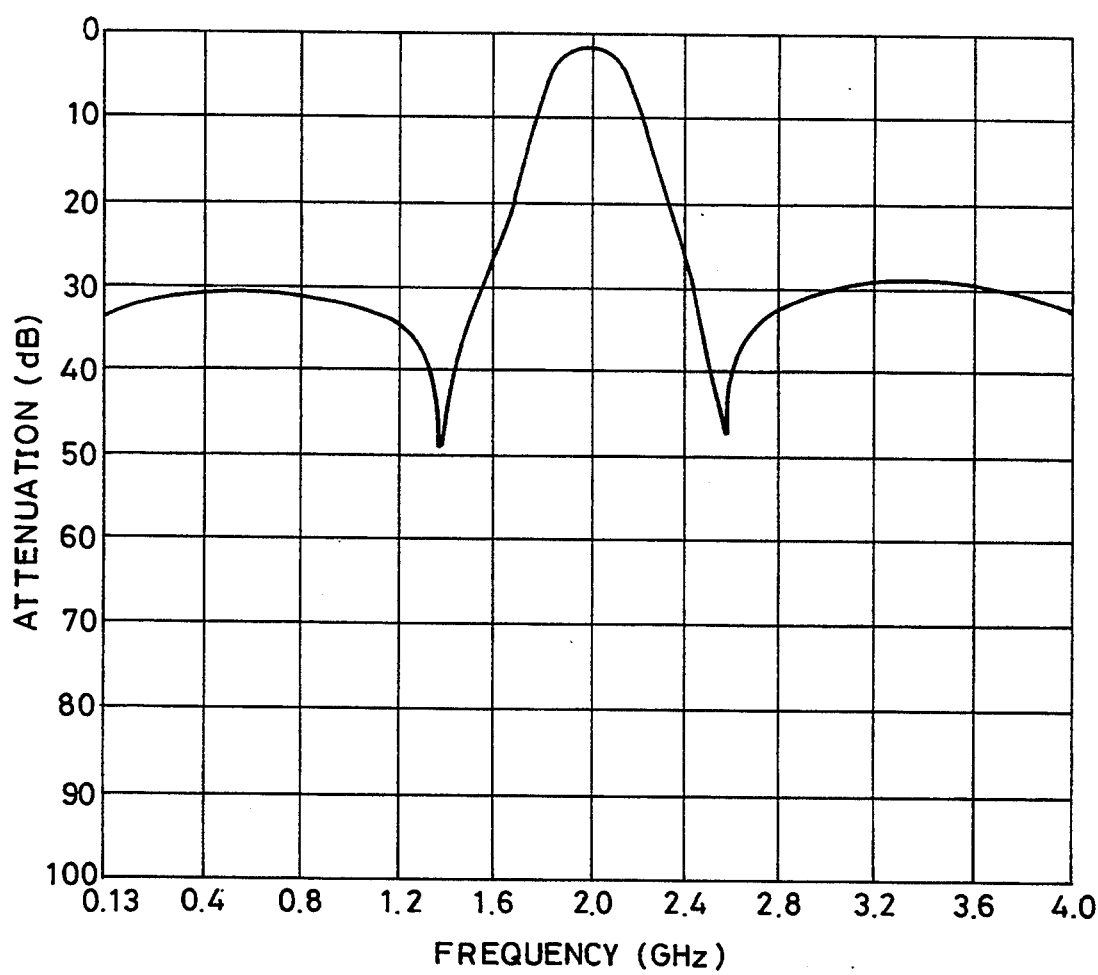

F I G. 16
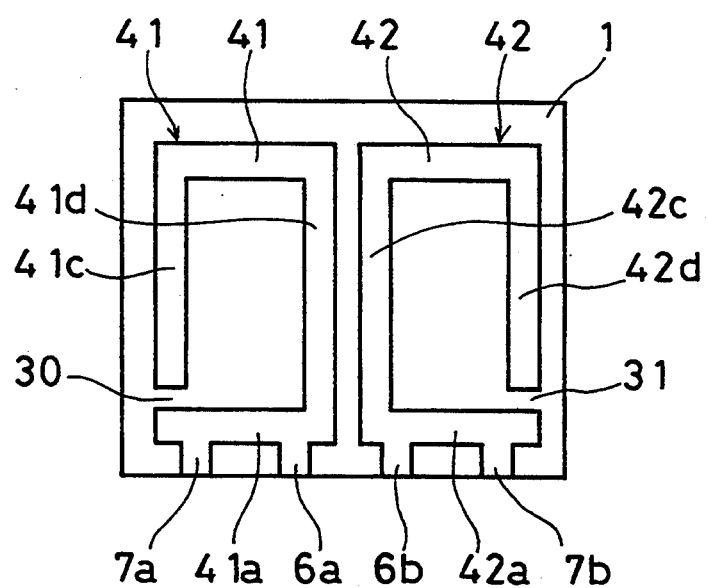

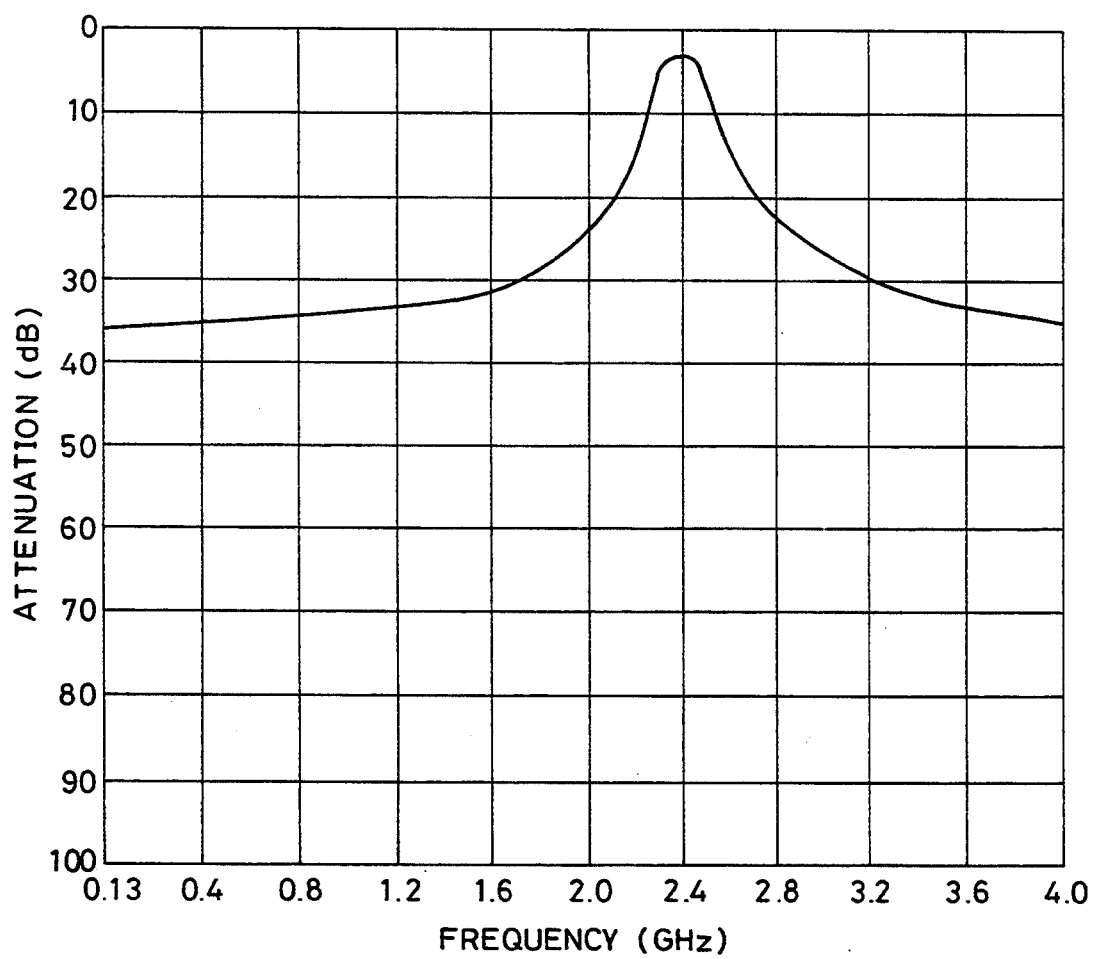
F I G.17

F I G. 18
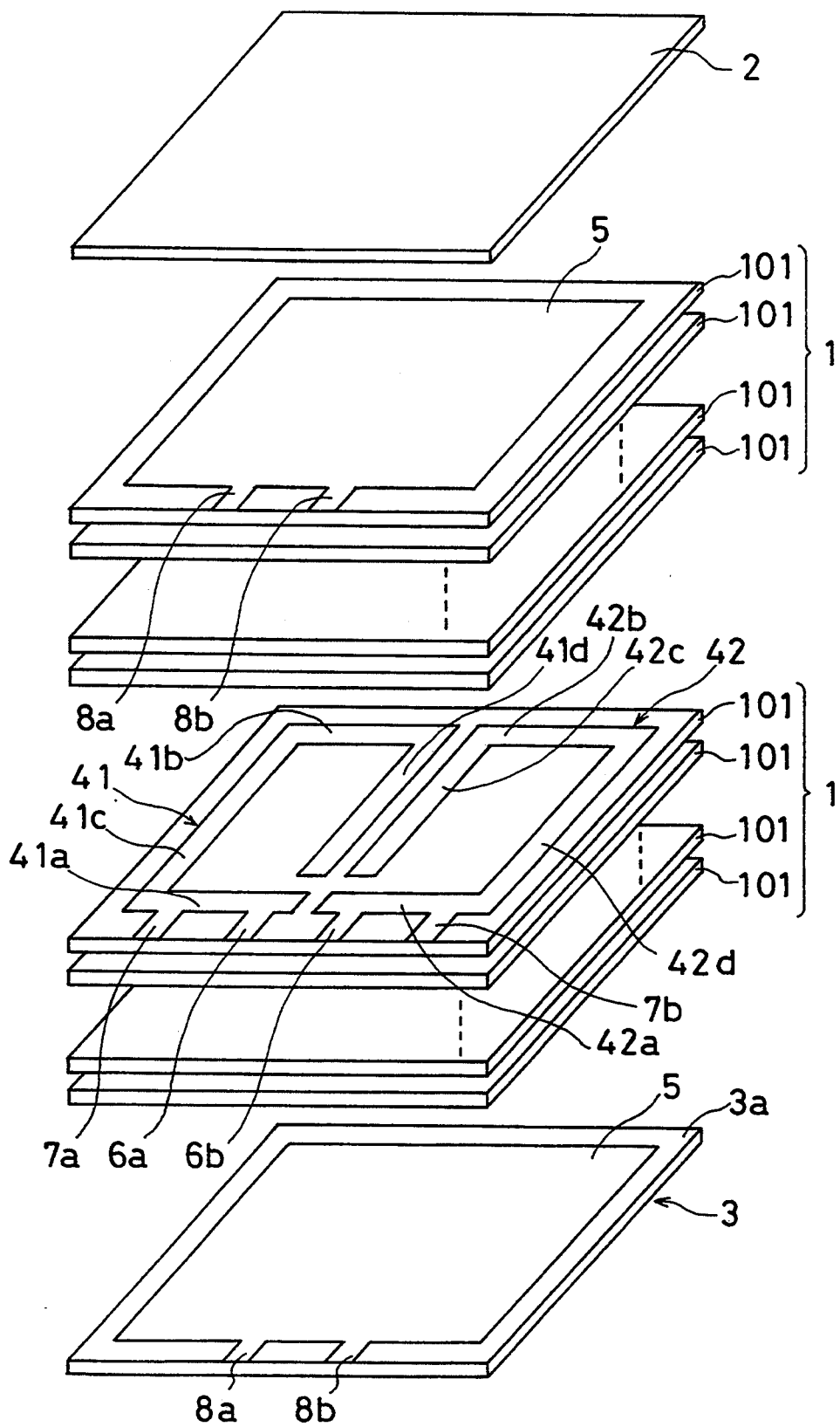

F I G. 19
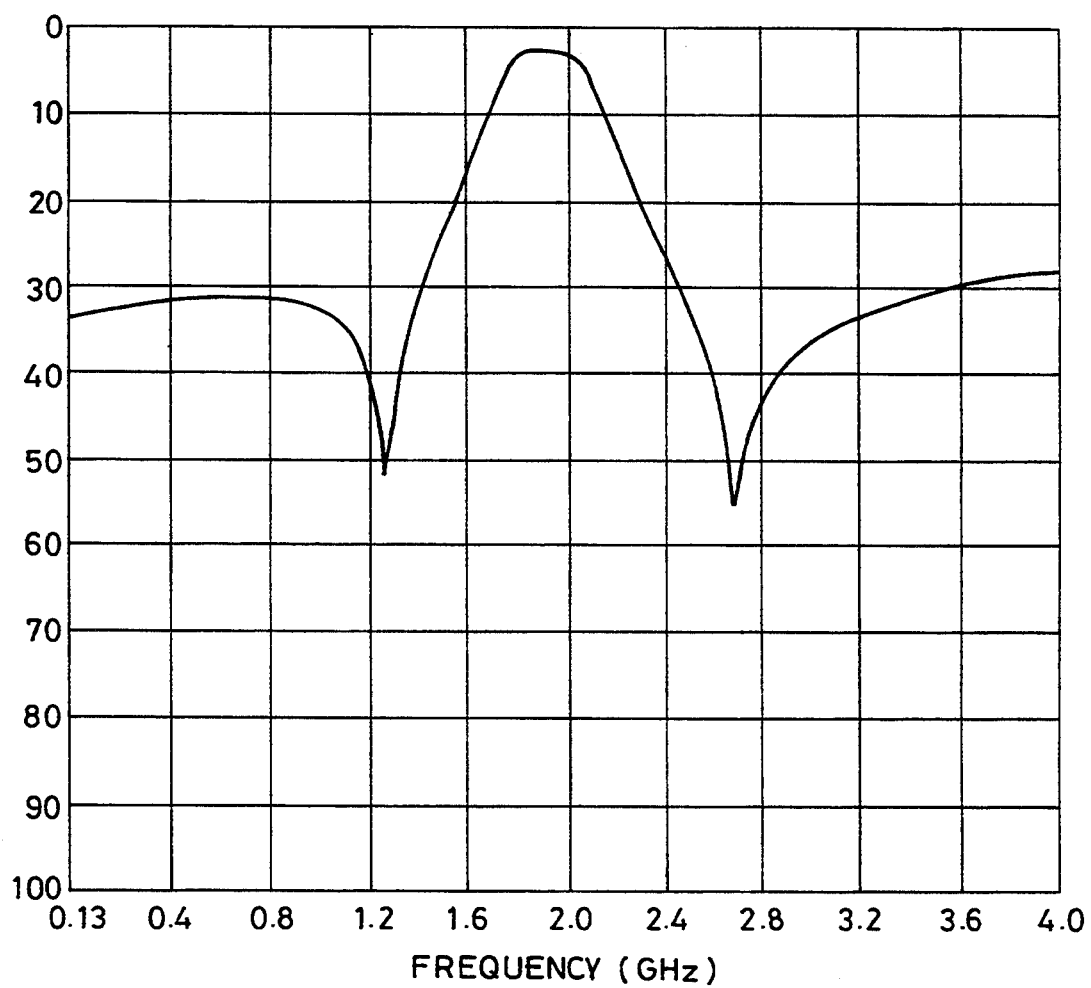

F I G. 21
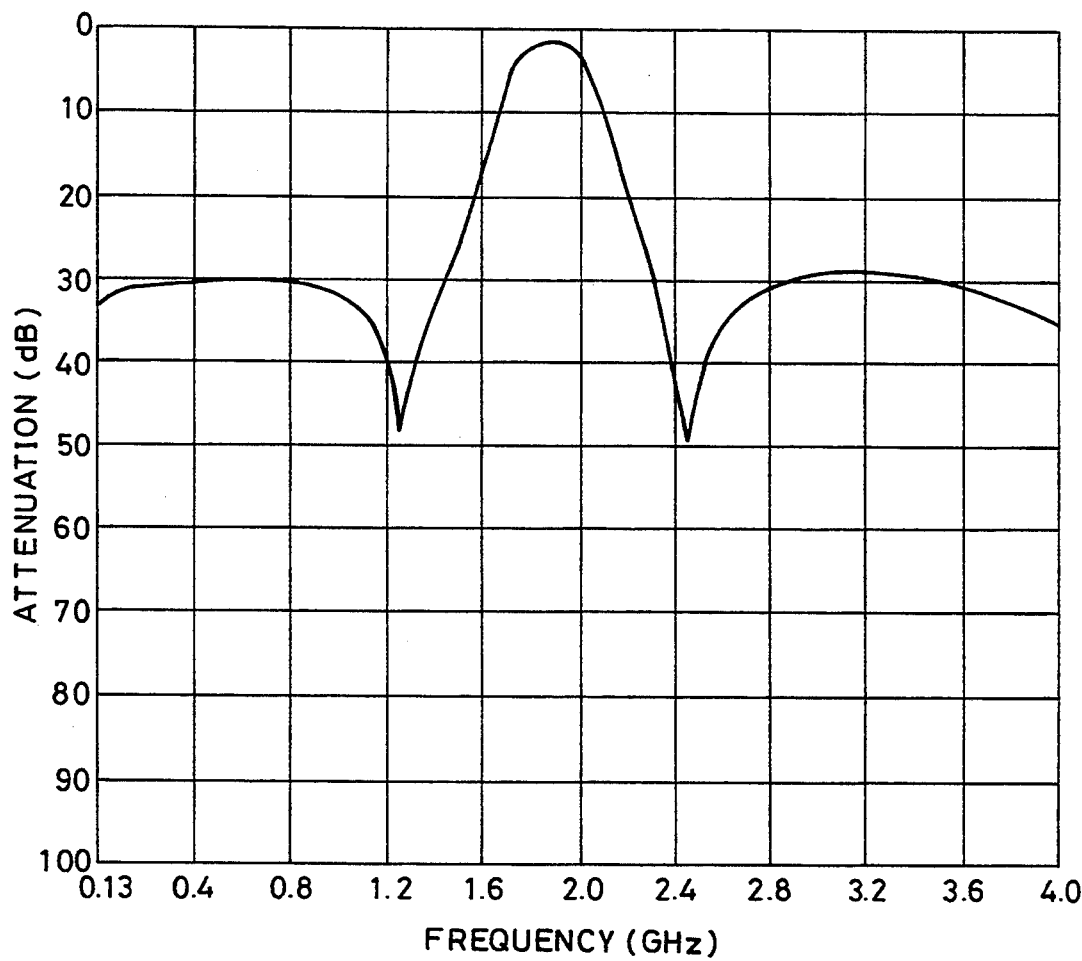

F I G. 27
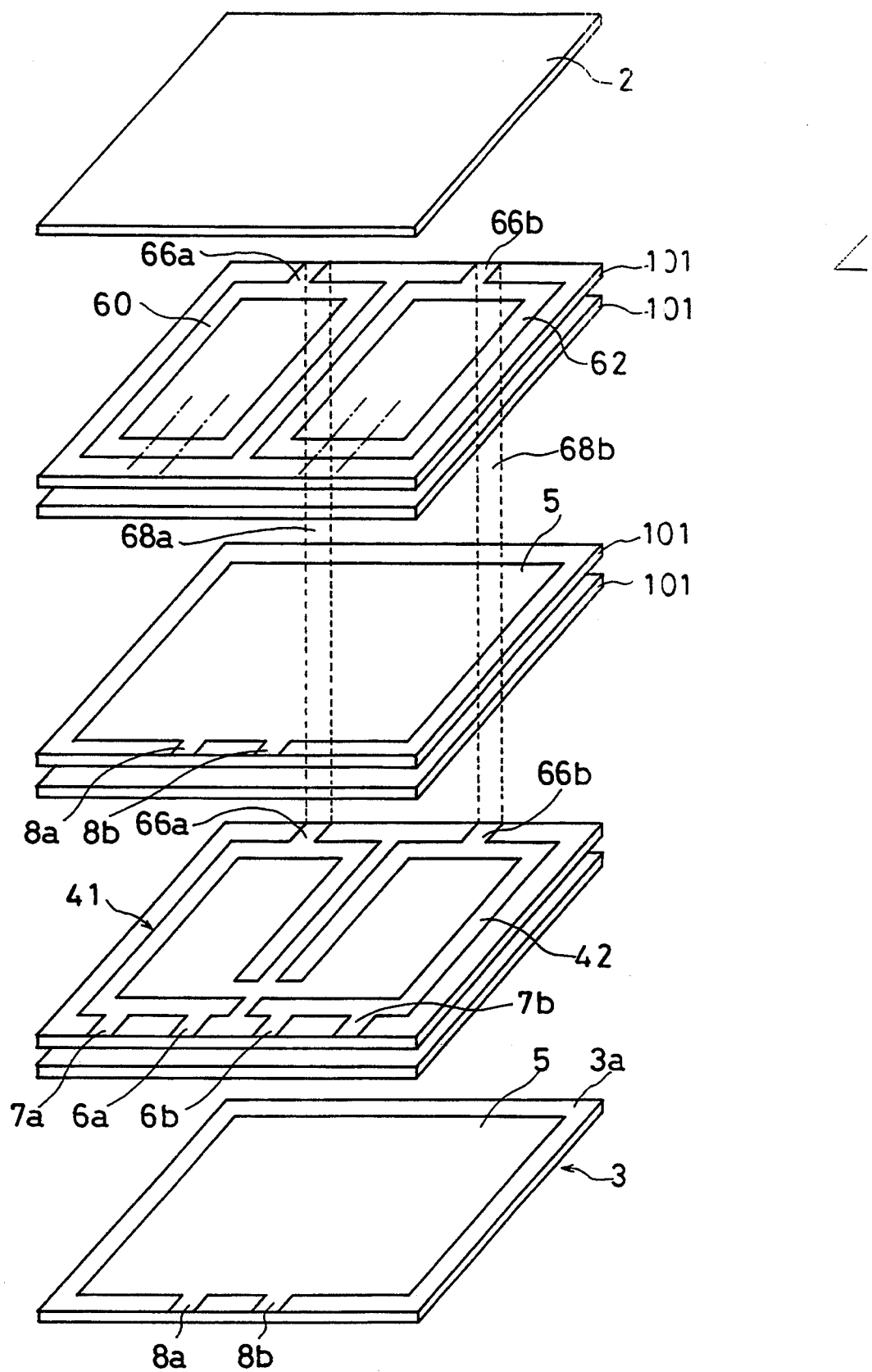

F I G. 28
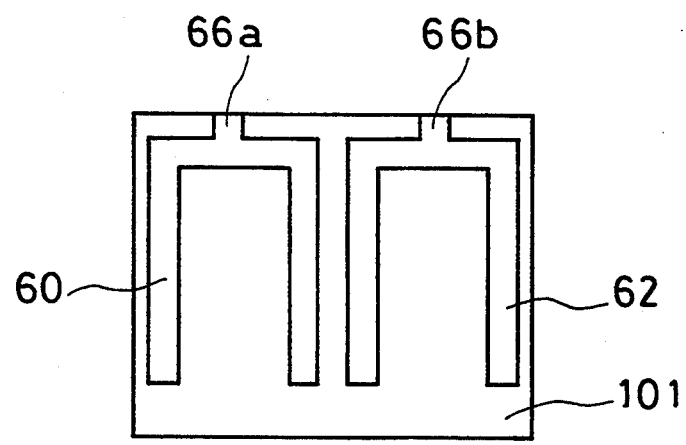

F I G. 30
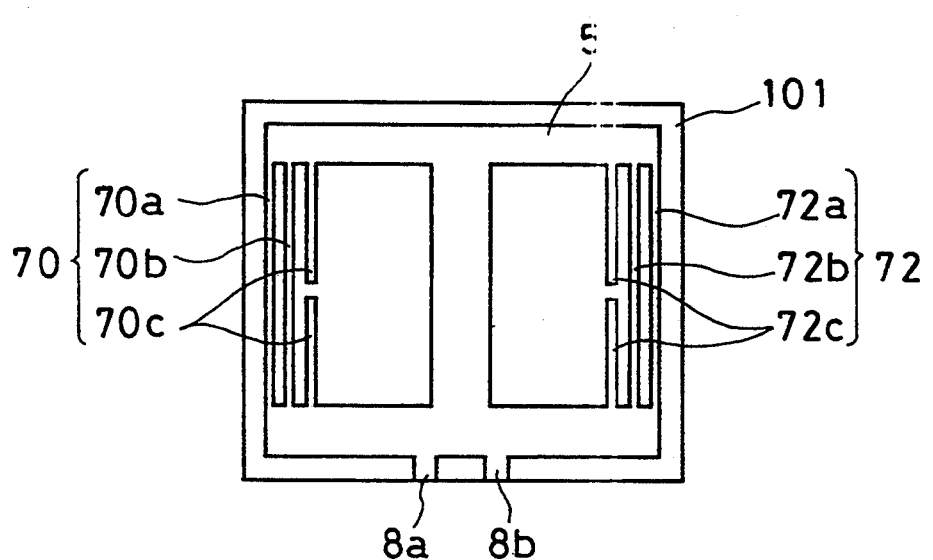

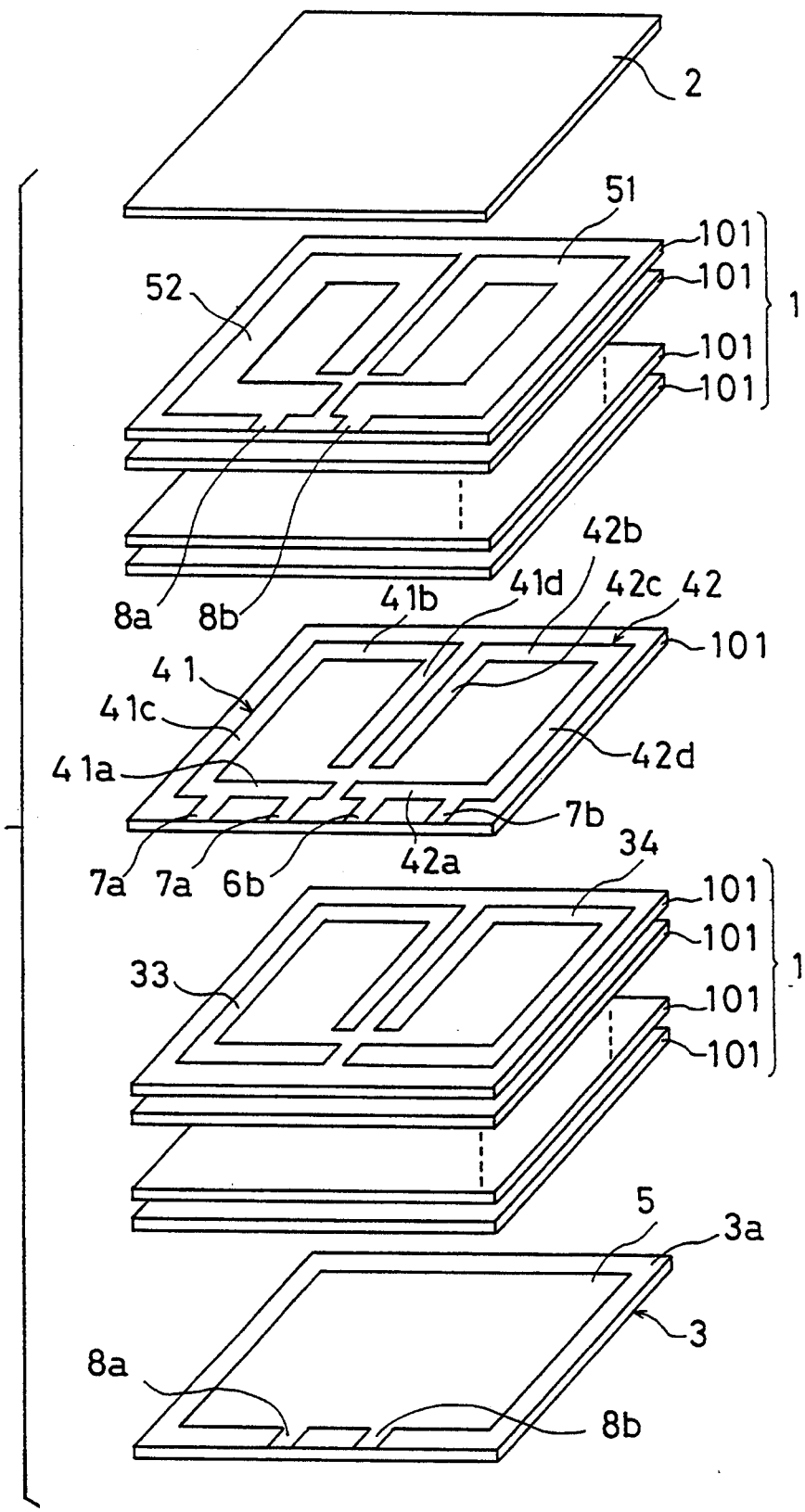
F I G. 36

BAND-PASS FILTER HAVING TWO LOOPED-SHAPED ELECTRODES

This is a continuation of application Ser. No. 07/833,095 filed on Feb. 10, 1992 (now abandoned).

BACKGROUND OF THE INVENTION

1. Field of the Invention

The present invention relates to a dielectric-laminate type band-pass filter for use in a portable radio and the like having frequency of several hundred MHz to several GHz.

2. Description of the Prior Art

It is possible to divide conventional resonators roughly into the resonator using a strip line and the resonator using a coil pattern. In a band-pass filter using such resonators, it is so plural resonators are connected magnetically.

Resonators using a strip line, include a resonator of ½ wavelength whose line is open at both ends as shown in FIG. 33, and a resonator of ¼ wavelength whose line is open at one end and shortcircuited at the other end as shown in FIG. 34.

Meanwhile, as the resonator using the coil pattern, as shown in FIG. 35, there is the one in which a spiral-shaped coil pattern 201 and an earth pattern 203 are formed on both sides of a dielectric layer 202 which is clamped therebetween.

In band-pass filters using the above-mentioned conventional types of resonator, however, the following problems were encountered respectively.

[1] band-pass filter using the strip line (a) A resonator having the resonance frequency of 2 to 3 GHz becomes substantially large. In particular, in the band-pass filter having a construction in which plural resonators are connected, it becomes considerably large. This is due to the following reasons.

That is, lengths $L_{10}$, $L_{11}$ of the strip line are determined as shown in Equation 1 (resonator of ½ wavelength) and Equation 2 (resonator of ¼ wavelength).

$$L_{10} = \frac{1}{2} \lambda \times \frac{1}{\sqrt{\epsilon}} \qquad \text{Equation 1}$$

$$L_{11} = \frac{1}{4} \lambda \times \frac{1}{\sqrt{\epsilon}} \ . \qquad \text{Equation 2}$$

Where, $\lambda$; wavelength, $\epsilon$; dielectric constant of dielectric-laminate sheet.

However, at present, a dielectric constant of the dielectric-laminate sheet which is capable of being co-fired with silver or copper and has a good temperature characteristic can not be made so large, only about $\epsilon \approx 10$. Thus, in the above Equations 1 and 2, when $\epsilon = 10$, $L_{10} = 15.8$ mm and $L_{11} = 7.9$ mm, which are very long, thus resulting in a large resonator (band-pass filter) as stated above.

(b) In the band-pass filter, it is desirable to adjust input/output impedances depending on the apparatus into which it is incorporated (for matching of the impedances of the band-pass filter and the apparatus). However, in the case of the strip-line type, since the input and output impedances have specific values for every strip line, it is impossible to adjust the matching, even by changing the input/output position from the strip line.

[2] band-pass filter using the coil-pattern

Since the coil pattern has a spiral shape, magnetic fluxes influence one another between the adjoining patterns, thus an electric current flow is difficult to obtain. Therefore, a substantial resistance increases and the Q value becomes lower.

For example, in FIG. 35, since the electric current flows in a same direction (both in a direction A in FIG. 35) in a pattern piece 201a and a pattern piece 201b, the corresponding magnetic fields cancel each other to cause the magnetic flux to become coarse, and consequently an electric current flow is disturbed and the substantial resistance increases.

A further problem is that an insertion loss of the band-pass filter becomes larger when the Q is reduced.

The passing band frequency of the band-pass filter depends on the resonance frequencies of the resonators. The resonance frequencies of the resonators are determined by the dimensions of their strip lines or coil-patterns, so once these patterns are formed, the resonance frequencies can not be adjusted. Therefore, when the dimensions of the patterns are in error, the passing band frequency of the band-pass filter is shifted from a predetermined desired value, resulting in an inferior product.

SUMMARY OF THE INVENTION

The present invention has been devised in view of such present circumstances, therefore, it is an object thereof to provide a band-pass filter which has a high Q and a low insertion loss, and moreover, whose size can be minimized, and whose input/output impedances and passing band frequency can be adjusted optionally.

The present invention is directed to a band-pass filter comprising, two first electrodes formed in a loop shape and disposed in a magnetically connecting state with each other; a second electrode formed in a plane shape opposite the first electrodes with a plate consisting of a dielectric material between the first electrodes and the second electrode; two earth terminals drawn out from the two first electrodes toward an edge portion of the plate; two input/output terminals drawn out from the two first electrodes toward the edge portion of the plate at a distance providing predetermined impedance from the earth terminals; and two other earth terminals drawn out from the second electrode toward the edge portion of the plate.

In regard to the band-pass filter, there may be two second electrodes formed opposite both sides of the first electrodes with plates between the first electrodes and both second electrodes.

In regard to the band-pass filter, at least one of the second electrodes may be divided into two electrode sections having a similar but somewhat larger shape than the first electrodes, and correspondingly the other earth terminals are drawn out respectively from the electrodes sections toward the edge portion of the plate or plates.

In regard to the band-pass filter, between the first electrodes a pair of and at least one of the second electrodes, third electrodes having the same shape as the first electrodes may be formed.

In regard to the band-pass filter, trimming electrodes in a loop shape or a part of loop shape may be formed at a distance from the second electrode on the opposite side of the second electrode, with a plate between the trimming electrodes and the second electrode, and connected to the first electrodes.

In regard to the band-pass filter, a plurality of trimming electrodes may be formed in a band or strip shape in the interior of the second electrode, and connected to the second electrode.

When the band-pass filter is constructed as stated above, because it is a so-called strip-line construction in which the first electrodes and the second electrodes are positioned on opposite sides of a dielectric material plate, and because pattern pieces of the first electrodes are not adjacent to each other as the spiral-shaped coil pattern, the Q value is improved remarkably and the insertion loss is reduced, improving skirt characteristics.

Moreover, since the first electrodes have a loop shape, the element size becomes smaller. In addition, since the impedance can be adjusted by just changing a distance between the input/output terminal and the earth terminal of the first electrodes, it is very simple to adjust the impedance.

The floating capacitance between the trimming electrodes and the second electrode is changed by trimming the trimming electrodes which are connected to the first electrodes, thereby changing the resonance frequency of each resonator. The passing band frequency of the band-pass filter is changed by changing the resonance frequency.

The magnetic field shield effect is changed by cutting the trimming electrodes formed within the second electrode. Hence, the magnetic field of each resonator is changed, and whereby the resonating frequency is changed, and the passing band frequency of the band-pass filter is changed as well.

In these respects, the invention provides a very excellent small-sized band-pass filter whose insertion loss is small and whose input/output impedances and passing band frequency can be adjusted optionally.

The above and further objects, features and advantages of the present invention will be more fully apparent from the following detailed description of several embodiments with reference to the accompanying drawings.

BRIEF DESCRIPTION OF THE DRAWINGS

FIG. 5 is a plan view showing a state where an earth electrode pattern is formed on the dielectric sheet of FIG. 3.

FIG. 6 is a front view when the dielectric sheets are laminated.

FIG. 7 is a side view when the dielectric sheets are laminated.

FIG. 11 is a graph showing frequency characteristics of the band pass filter shown in FIG. 1.

FIG. 12 is a plan view of essential portions of a band-pass filter according to a second example of the present invention.

FIG. 13 is a graph showing frequency characteristics of the band-pass filter shown in FIG. 12.

FIG. 15 is a graph showing frequency characteristics of the band-pass filter shown in FIG. 14.

FIG. 16 is a plan view of essential portions of a band-pass filter according to a fourth example of the present invention.

FIG. 17 is a graph showing frequency characteristics of the band-pass filter shown FIG. 16.

FIG. 18 is an exploded perspective view of a band-pass filter according to a fifth example of the present invention.

FIG. 19 is a graph showing frequency characteristics of the band-pass filter shown in FIG. 18.

FIG. 21 is a graph showing frequency characteristics of the band-pass filter shown in FIG. 20.

FIG. 27 is an exploded perspective view of a band-pass filter according to an eighth example of the present invention.

FIG. 28 is a plan view showing a modification of the band-pass filter of FIG. 27.

FIG. 30 is a plan view showing a state of cutting trimming electrodes of the band-pass filter of FIG. 29.

FIG. 36 is an exploded perspective view of a band-pass filter according to an additional example of the present invention.

DESCRIPTION OF THE PREFERRED EMBODIMENTS (First Example)

Figure 1:
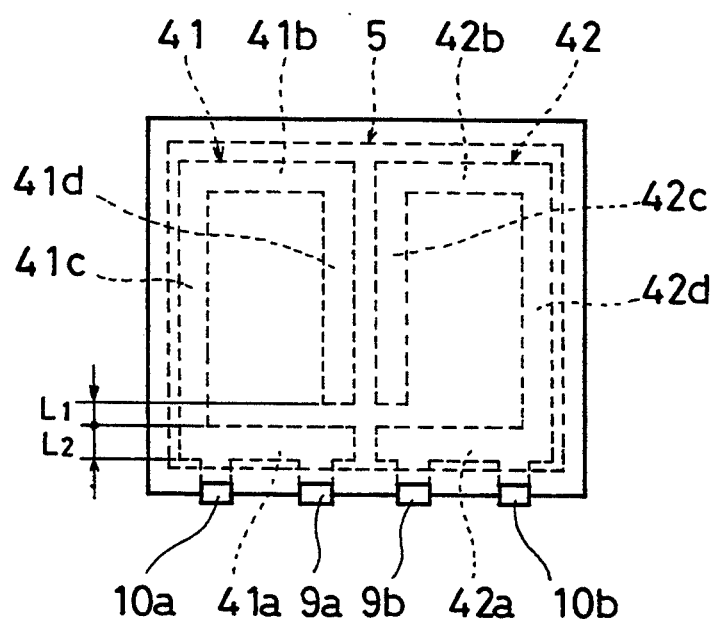
FIG. 1 is a plan view of a band-pass filter according to a first example of the present invention.
Figure 2:
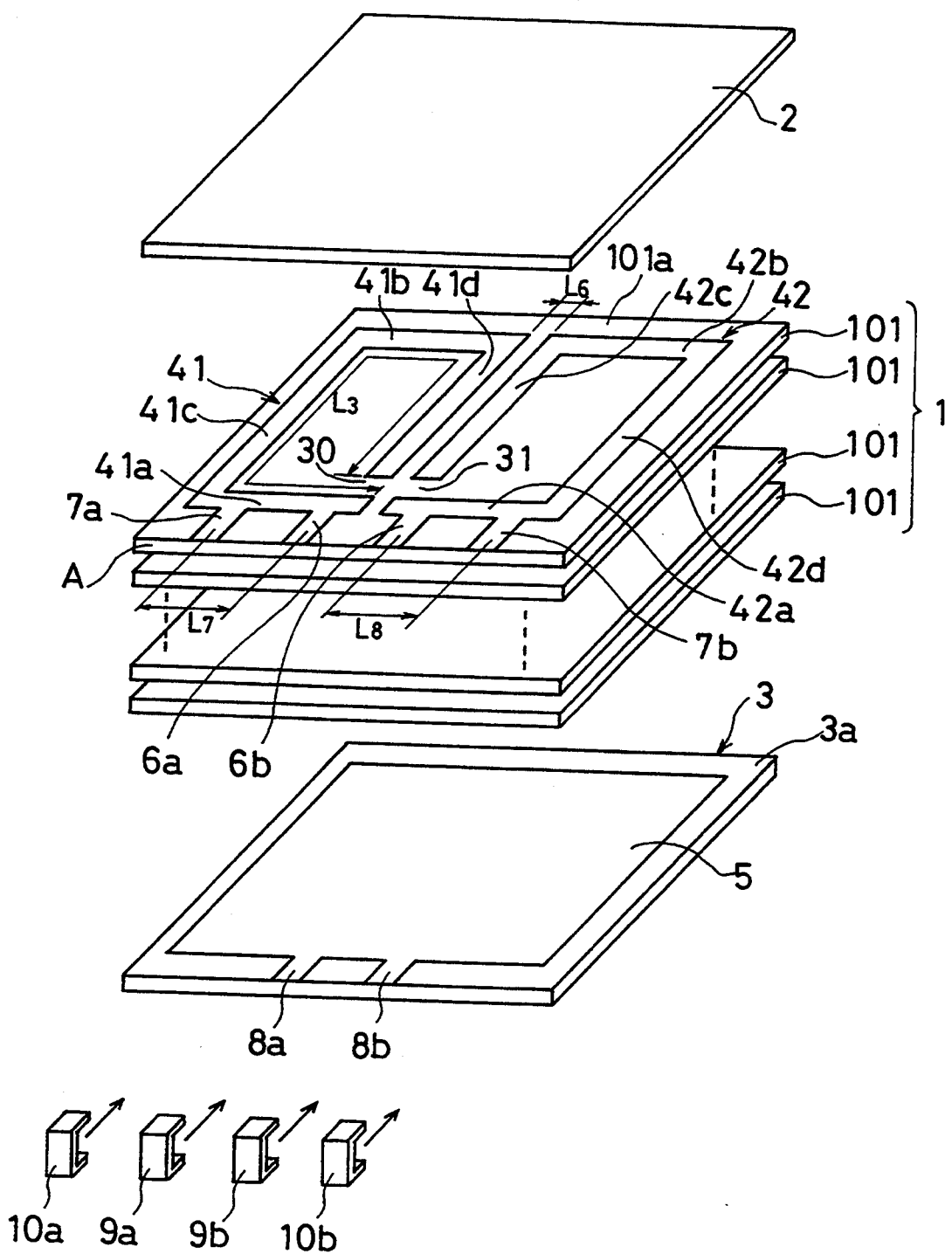
FIG. 2 is an exploded perspective view of the band-pass filter according to the first example of the present invention.
Figure 3:
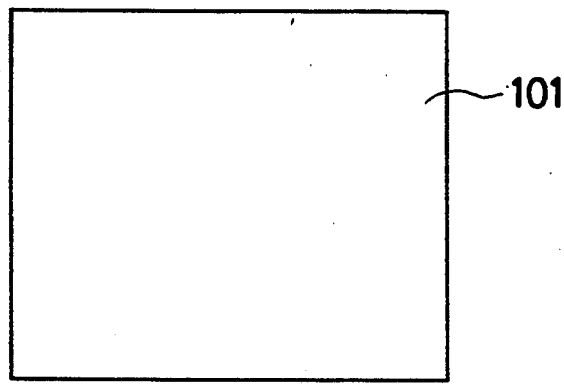
FIG. 3 is a plan view of a dielectric sheet used in the present invention.
Figure 4:
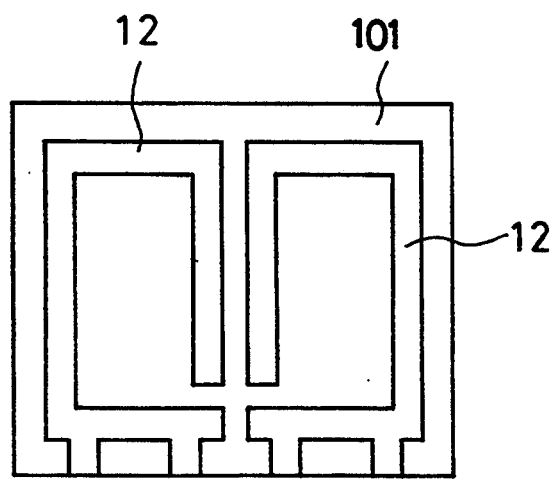
FIG. 4 is a plan view showing a state where coil electrode patterns are formed on the dielectric sheet of FIG. 3.
Figure 8:
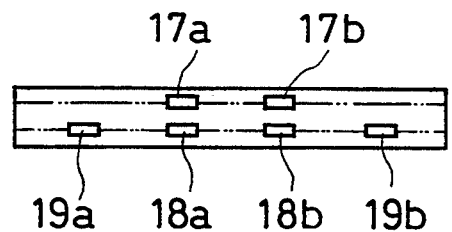
FIG. 8 is a front view when a laminate is pressed.
Figure 9:
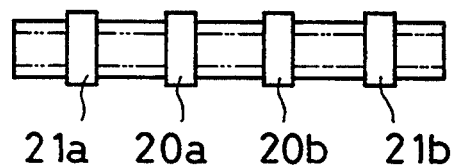
FIG. 9 is a front view when external electrodes are formed.
Figure 10:
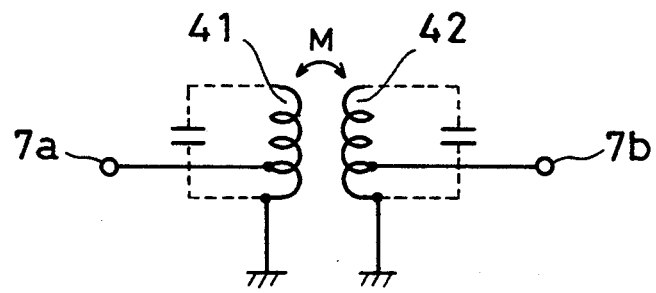
FIG. 10 is an equivalent circuit diagram of the band-pass filter shown in FIG. 1.

A first example of the present invention is described in the following with reference to FIG. 1 through FIG. 11. FIG. 1 and FIG. 2 are views showing a construction of a band-pass filter according to the first example of the present invention, wherein FIG. 1 is a plan view and FIG. 2 is an exploded perspective view, FIG. 3 is a plan view of a dielectric sheet used in the present invention, FIG. 4 is a plan view showing a state where coil electrode patterns are formed on the dielectric sheet of FIG. 3, FIG. 5 is a plan view showing a state where an earth electrode pattern is formed on the dielectric sheet of FIG. 3, FIG. 6 and FIG. 7 are views when the dielectric sheets are laminated, wherein FIG. 6 is a front view and FIG. 7 is a side view, FIG. 8 is a front view when a laminate is pressed, FIG. 9 is a front view when external electrodes are formed, FIG. 10 is an equivalent circuit diagram of the band-pass filter and FIG. 11 is a graph showing frequency characteristics of the band-pass filter.

As shown in FIG. 1 and FIG. 2, the band-pass filter of the present invention comprises, a dielectric layer 1 consisting of plural dielectric sheets 101 . . . and protective layers 2, 3 provided on upper and lower sides of the dielectric layer 1. On one surface 101a of the top dielectric sheet 101, two coil electrode patterns (first electrodes) 41 and 42 are formed and disposed symmetrically with respect to the right and left directions as shown in the drawings. These are fired and integrated with one another.

A specific construction of the coil electrode pattern 41 is such that, pattern pieces 41a and 41b which are linear and disposed on the opposite sides are connected via a linear pattern piece 41c which is connected to first ends of the pattern pieces 41a, 41b, and on the other end of the pattern piece 41b a pattern piece 41d which is extended toward the pattern piece 41a so as to be parallel to the pattern piece 41c is formed (that is, forming a loop shape).

The electrode pattern is so constructed that a total length $L_3$ of the coil electrode pattern 41 becomes the length shown Equation 3.

$$L_3 = \frac{1}{4} \lambda \times \frac{1}{\sqrt{\epsilon}}.$$ Equation 3

Where, $\lambda$; wavelength, $\epsilon$; dielectric constant.

It is desirable that a distance $L_1$ between the pattern piece 41d and the pattern piece 41a is equal to or less than a width $L_2$ of the pattern piece 41a, 41b, 41c or 41d. In the following examples, a distance between the pattern pieces 41a and 41d is called a gap 30.

The coil electrode pattern 42 has a symmetrical shape with respect to the coil electrode pattern 41 as shown in FIG. 1, and the pattern pieces 41d, 42c of the coil electrode patterns 41, 42 are disposed in a adjoining fashion with each other. In the following examples, a distance between the pattern pieces 42a and 42c is called a gap 31.

To the coil electrode patterns 41, 42, respective earth terminal patterns 6a, 6b and respective input/output terminal patterns 7a, 7b are connected, and end portions of these earth terminal patterns 6a, 6b and input/output terminal patterns 7a, 7b are extended to a side face A of the band-pass filter.

An earth electrode pattern (second electrode) 5 is formed on a face 3a of the protective layer 3 facing the dielectric layer 1, and is constituted substantially across the entire face 3a such that the size of the earth electrode pattern 4 becomes larger than a eriphery of the coil electrode patterns 41 and 42. Also, at positions on the face 3a corresponding to the earth terminal patterns 6a and 6b, earth terminal patterns (other earth terminals) 8a and 8b are connected at first ends to the earth electrode pattern 5 and are extended at other ends to the side face A of the band-pass filter. And, the earth terminal pattern 6a and the earth terminal pattern 8a are connected to an external earth electrode 9a, the earth terminal pattern 6b and the earth terminal pattern 8b are connected to an external earth electrode 9b, the input/output terminal pattern 7a is connected to an external input/output electrode 10a, and the input/output terminal pattern 7b is connected to an external input/output electrode 10b. The external earth electrodes 9a, 9b and the external take-out electrodes 10a, 10b have a U-shaped cross section and are formed on the side faces of the band-pass filter.

The band-pass filter having the above-mentioned construction was produced by the following procedures.

First, on one surface of a dielectric sheet 101 (about several tens of $\mu$m thick) shown in FIG. 3, a copper paste or the like is coated to form patterns (the same patterns as the coil electrode patterns 41, 42 and the terminal patterns 6a, 6b, 7a, 7b) 12 as shown in FIG. 4. While, in parallel thereto, on one surface of a protective sheet 11 having the same configuration as the dielectric sheet 101 (however, the thickness may be different), the copper paste or the like is coated to form a pattern (same pattern as the earth electrode pattern 5 and the earth terminal patterns 8a, 8b) 13 as shown in FIG. 5.

Next, as shown in FIG. 6 and FIG. 7, a protective sheet 2, a sheet layer 16 and the protective sheet 11 (the same construction as the protective sheet 2) are laminated, and further, are pressed to produce a laminate 15. Then, at locations (the locations which serve as the external earth electrodes 9a, 9b and the external input/output electrodes 10a, 10b) corresponding to exposed portions 17a, 17b, 18a, 18b, 19a, 19b of the paste layers shown in FIG. 8, copper paste or the like is printed or coated to produce paste layers 20a, 20b, 21a and 21b as shown in FIG. 9. Then, the dielectric sheets are integrated by firing the laminate, thereby producing the band-pass filter. Alternatively, the laminate may be fired by a process separate from firing the paste layers 20a, 20b, 21a and 21b.

Now, though no capacitor pattern is formed on the band-pass filter which is produced to the above-mentioned manner, it has an equivalent circuit as shown in FIG. 10 (in the figure, reference character M designates a magnetic connection). This is due to two reasons shown in the following.

1. The coil electrode patterns 41, 42 and the earth electrode pattern 5 are at the same potential (that is, they are both in the earthed state).

2. Since the dielectric layer 1 is interposed between the coil electrode patterns 41, 42 and the earth electrode pattern 5, a floating capacitance is produced.

Since the capacitor is formed in such a manner and since the pattern pieces 41d, 42c of the coil electrode patterns 41, 42 are magnetically connected, the filter has the equivalent circuit as shown in FIG. 10.

Since the above-mentioned floating capacitance is mainly produced between the coil electrode patterns 41, 42 and the earth electrode pattern 5, by bringing the coil electrode patterns 41, 42 and the earth electrode pattern 5 close to or apart from one another, the capacitance of the capacitor changes and it is possible to change the frequency of the pass band. Specifically, when the coil electrode patterns 41, 42 and the earth electrode pattern 5 are brought close to one another (reducing the number of the dielectric sheets 101), since the capacitance of the capacitor increases, the pass band frequency becomes lower, while when the coil electrode patterns 41, 42 and the earth electrode pattern 5 are brought apart from one another (increasing the number of the dielectric sheets 101), since the capacitance of the capacitor decreases, the pass band frequency becomes higher. The floating capacitance can also be changed by changing the dielectric constant of the dielectric layer 1 or the size of the coil electrode patterns 41, 42. For example, when a width $L_2$ of the coil electrode patterns 41, 42 is broadened, the size of the filter can be minimized because the floating capacitance becomes larger and the passing band frequency can be lowered. However, when distances between the pattern pieces 41a and 41b, pattern pieces 41c and 41d, pattern pieces 42a and 42b and pattern pieces 42c and 42d are too narrow, the waveform is deteriorated, so that it is not desirable to unnecessarily broaden the width $L_2$ of the coil electrode patterns 41, 42.

Furthermore, a band width of the above-mentioned band-pass filter is changed by changing a distance $L_6$ between the pattern pieces 41d and 42c. Specifically, when the distance $L_6$ is narrowed, the band width becomes wider, while when the distance $L_6$ is broadened, the band width becomes narrower. However, it is not desirable to unnecessarily narrow the distance $L_6$ as it shows a double-humped characteristic.

Input/output impedances are changed by changing a distance $L_7$ between the earth terminal pattern 6a and the input/output terminal pattern 7a, or a distance $L_8$ between the earth terminal pattern 6b and the input/output terminal pattern 7b.

According to an experiment, by adjusting a dielectric constant or thickness of the dielectric layer 1 or an area of the coil electrode pattern 4, applicable frequencies of the band-pass filter of the present invention could be adjusted in the range of several hundred MHz to several GHz. An example thereof is shown in the following experiment.

(Experiment)

Frequency characteristics of the band-pass filter having the above-mentioned construction were examined, and the result is shown in FIG. 11.

(Other respects)

1. The band-pass filter of the present invention may be installed and soldered while electrodes on a printed circuit board and the external earth electrodes 9a, 9b and the external input/output electrodes 10a, 10b are positioned against one another. At this time, since outsides are the outside of the filter is covered with the protective layers 2, 3, the coil electrode patterns 41, 42 and the earth electrode pattern 5 are protected from damages.

2. The dielectric layer 1 is not limited to the construction where several thin dielectric sheets 101 are laminated, but rather a dielectric sheet which is formed into a predetermined thickness beforehand may be used.

3. The band-pass filter of the present invention need not be produced one by one, but rather may be produced by forming plural coil electrode patterns 41, 42 on a broad dielectric sheet, and forming the same number of earth electrode patterns 5 on a similar dielectric sheet, laminating, an then cutting the laminates apart one by one for firing.

(Second Example)

A second example of the present invention is described in the following with reference to FIG. 12 and FIG. 13. FIG. 12 is a plan view of essential portions of a band-pass filter according to the second example of the present invention, and FIG. 13 is a graph showing frequency characteristics of the band-pass filter shown in FIG. 12. Parts having the same function as in the first example are designated by the same reference numerals and their descriptions are omitted. This applies also to the following examples.

As shown in FIG. 12, it has the same configuration as the first example, except that end portions of the pattern pieces 41d, 42c are respectively connected to end portions of the pattern pieces 41a, 42a (that is, gaps 30, 31 are not formed).

(Experiment)

Frequency characteristics of the band-pass filter having the above-mentioned construction were examined, and the result is shown in FIG. 13.

(Third Example)

Figure 14:
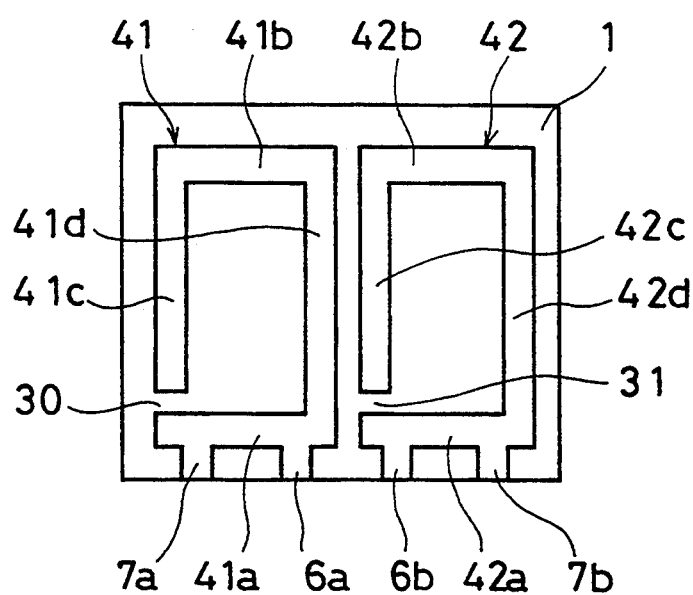
FIG. 14 is a plan view of essential portions of a band-pass filter according to a third example of the present invention.

A third example of the present invention is described in the following with reference to FIG. 14 and FIG. 15. FIG. 14 is a plan view of essential portions of a band-pass filter according to the third example of the present invention, and FIG. 15 is a graph showing frequency characteristics of the band-pass filter shown in FIG. 14.

As shown in FIG. 14, it has the same configuration as the first example, except an end portion of the pattern piece 41d is connected to an end portion of the pattern piece 41a, and a gap 30 of the coil electrode pattern 41 is formed between the pattern piece 41a and pattern piece 41c.

(Experiment)

Frequency characteristics of the band-pass filter having the above-mentioned construction were examined, and the result is shown in FIG. 15.

(Fourth Example)

A fourth example of the present invention is described in the following with reference to FIG. 16 and FIG. 17. FIG. 16 is a plan view of essential portions of a band-pass filter according to the fourth example of the present invention, and FIG. 17 is a graph showing frequency characteristics of the band-pass filter shown in FIG. 16.

As shown in FIG. 16, it has the same configuration as the first example, except end portions of pattern pieces 41d, 42c are connected to end portions of pattern pieces 41a, 42a respectively, and the gaps 30, 31 of the coil electrode patterns 41, 42 are formed respectively between the pattern piece 41a and 41c, and between the pattern pieces 42a and 42d.

(Experiment)

Frequency characteristics of the band-pass filter having the above-mentioned construction were examined, and the result is shown in FIG. 17.

(Fifth Example)

Figure 20:
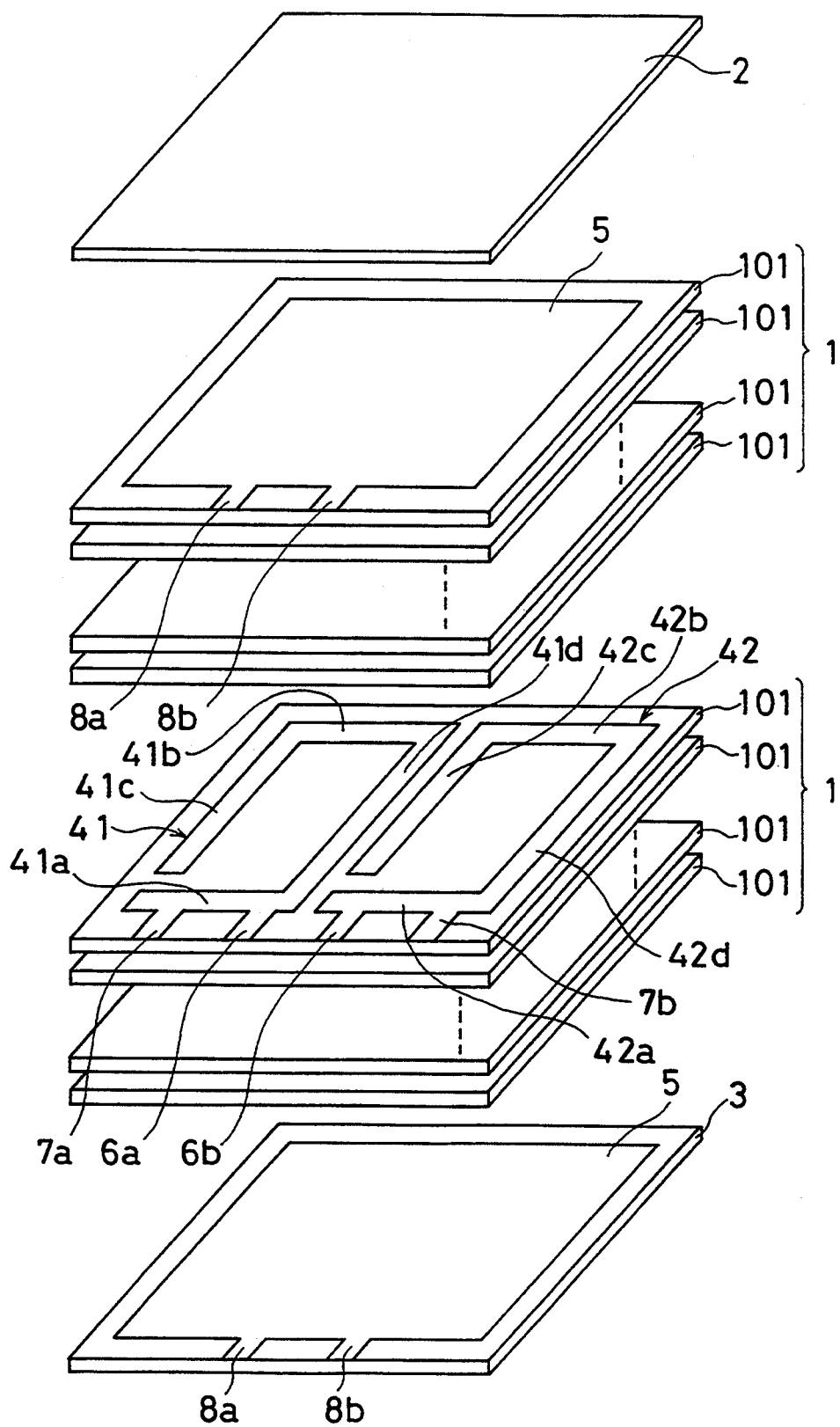
FIG. 20 is an exploded perspective view showing a modification of the band-pass filter of the fifth example.
Figure 22:
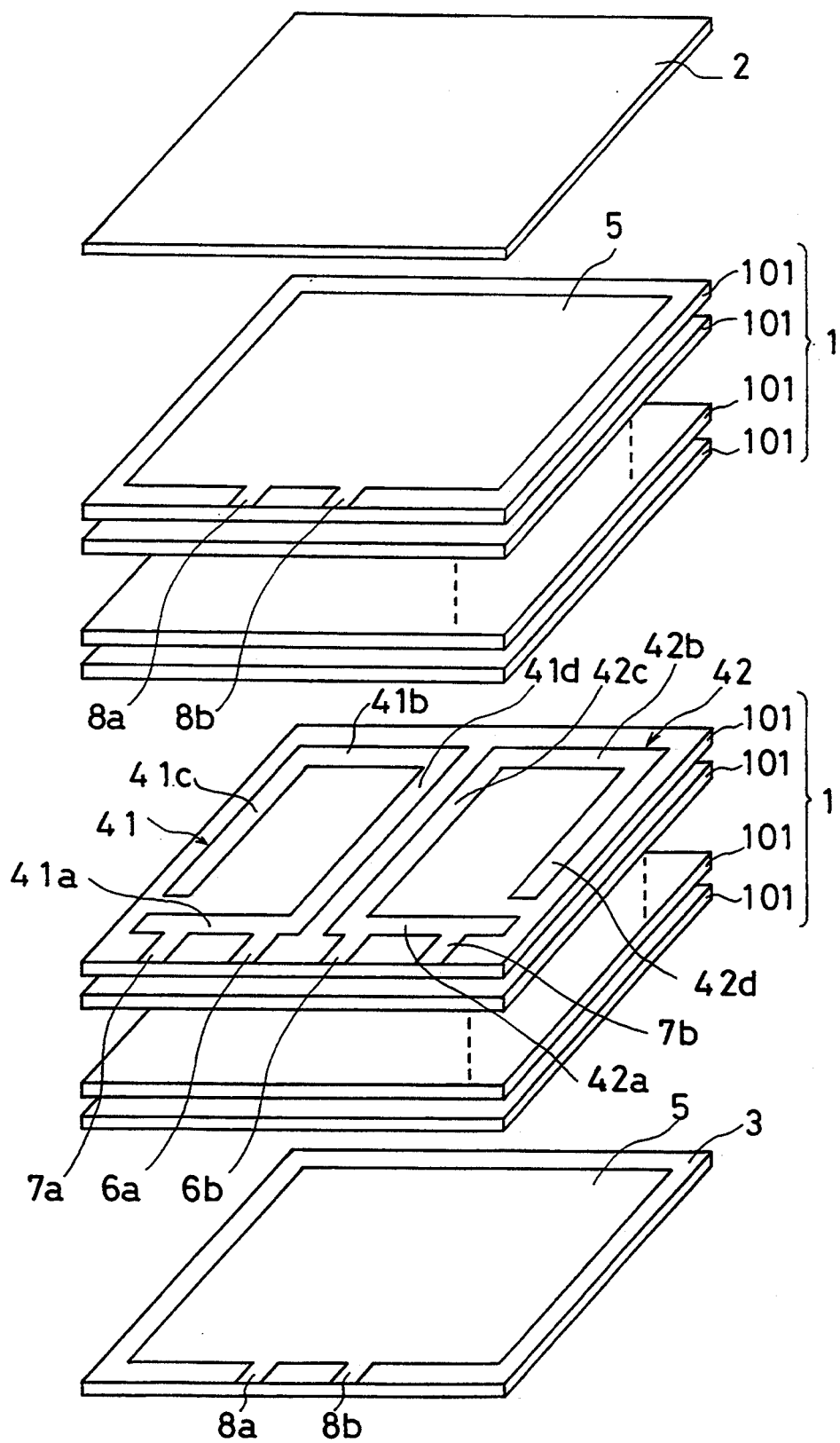
FIG. 22 is an exploded perspective view showing an another modification of the band-pass filter of the fifth example.

A fifth example of the present invention is described in the following with reference to FIG. 18 through FIG. 23. FIG. 18, FIG. 20, FIG. 22 are exploded perspective views of a band-pass filter according to the fifth example of the present invention, and FIG. 19, FIG. 21 and FIG. 23 are graphs respectively showing frequency characteristics of the band-pass filters shown in FIG. 18, FIG. 20 and FIG. 22.

As shown in FIG. 18, FIG. 20 and FIG. 22, they respectively have the same construction as the first example, the third example and the fourth example, except that dielectric layer 1 and earth electrode pattern 5 are disposed in order not only on one side but both sides of the coil electrode patterns 41, 42.

(Experiment)

Figure 23:
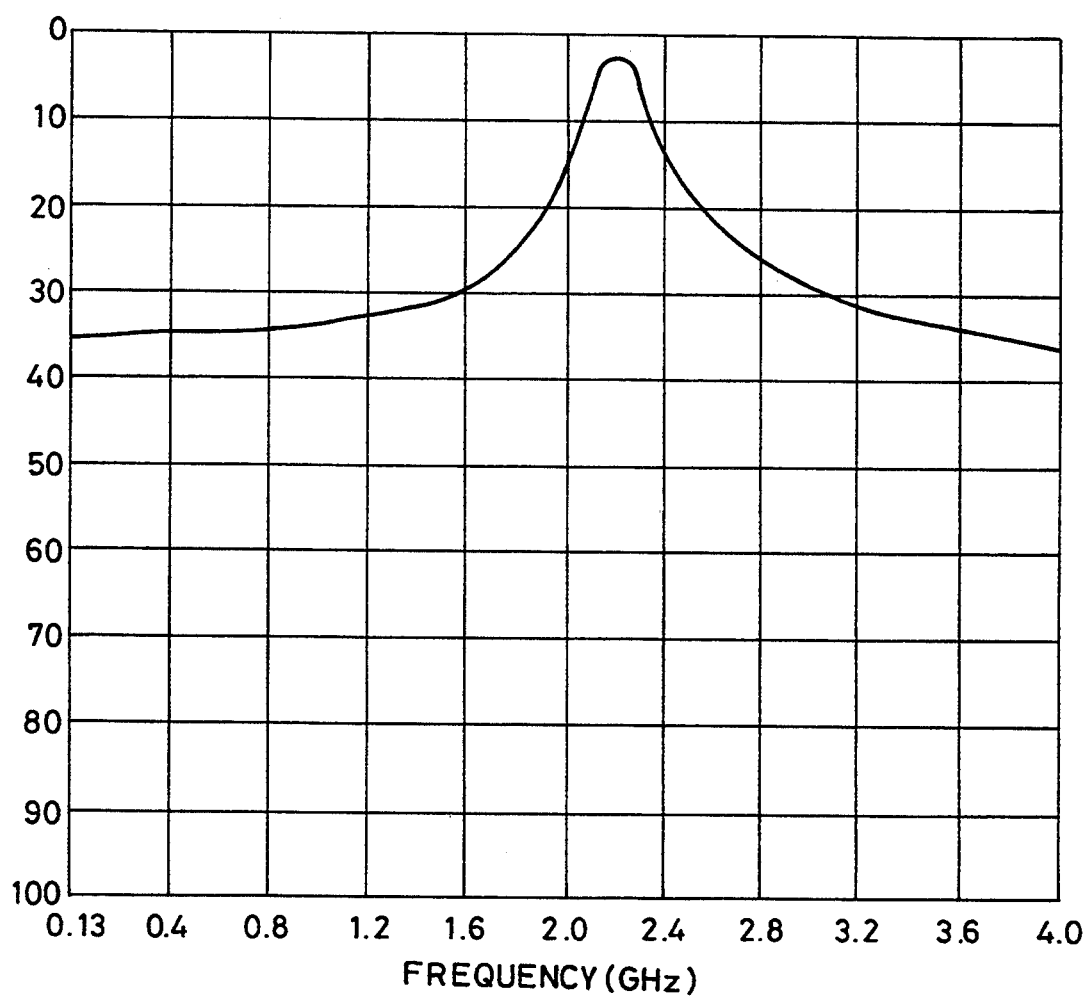
FIG. 23 is a graph showing frequency characteristics of the band-pass filter shown in FIG. 22.

Frequency characteristics of the band-pass filters having the above-mentioned construction were examined, and the results are shown in FIG. 19, FIG. 21 and FIG. 23.

As is obvious from FIG. 19, FIG. 21 and FIG. 23, it is observed that the above-mentioned band-pass filters have somewhat low passband frequencies, like the first example, the third example and fourth example.

This is believed to be because a capacitance formed in the band-pass filter increases, because a floating capacitance is formed not only on one side but rather on both sides of the coil electrode patterns 41, 42.

Although not shown in the above-mentioned example, it has been confirmed by an experiment that a same effect as previously stated is obtained even when a band-pass filters shown in the second example are modified according to this example.

(Sixth Example)

Figure 24:
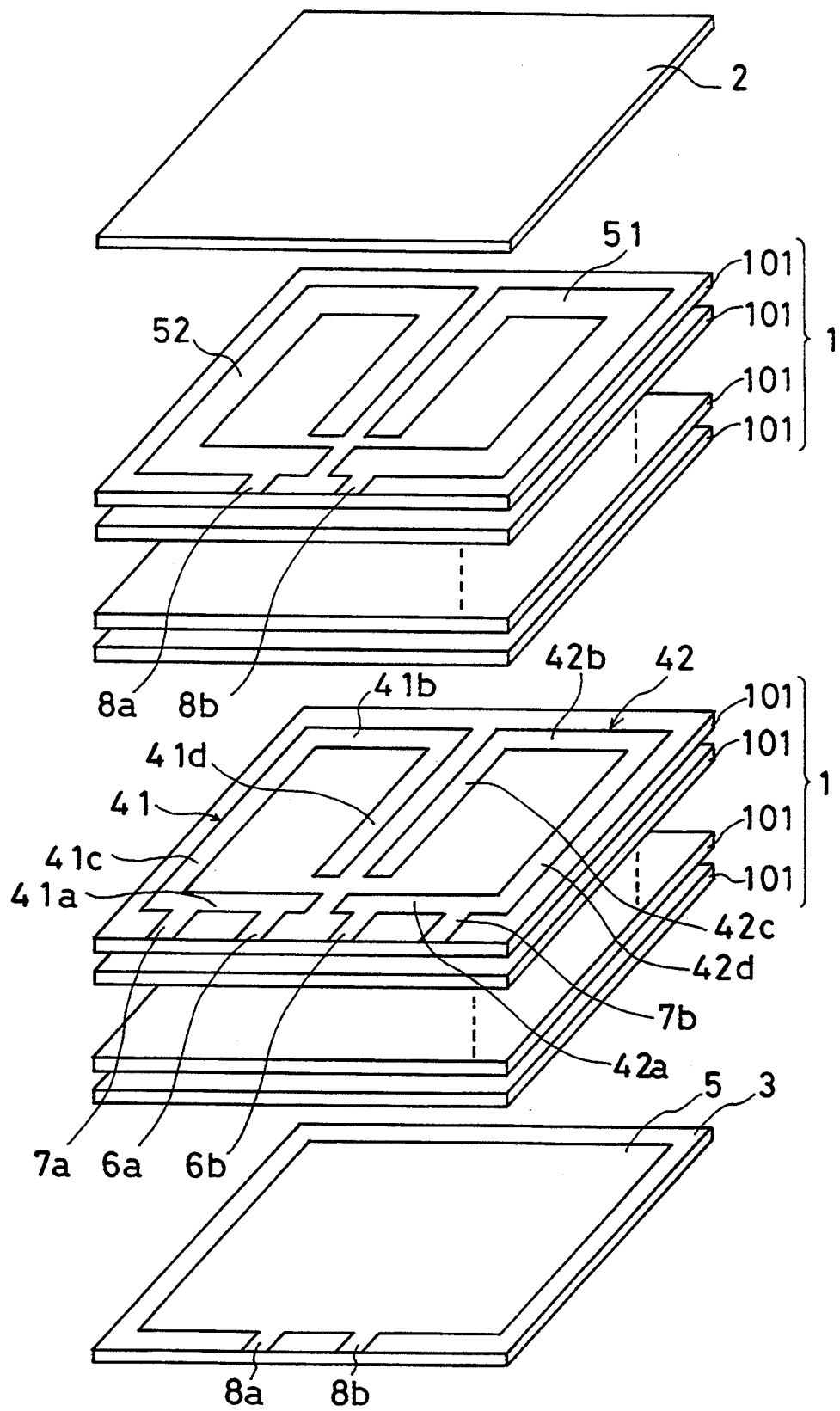
FIG. 24 is an exploded perspective view showing a band-pass filter according to a sixth example of the present invention.
Figure 25:
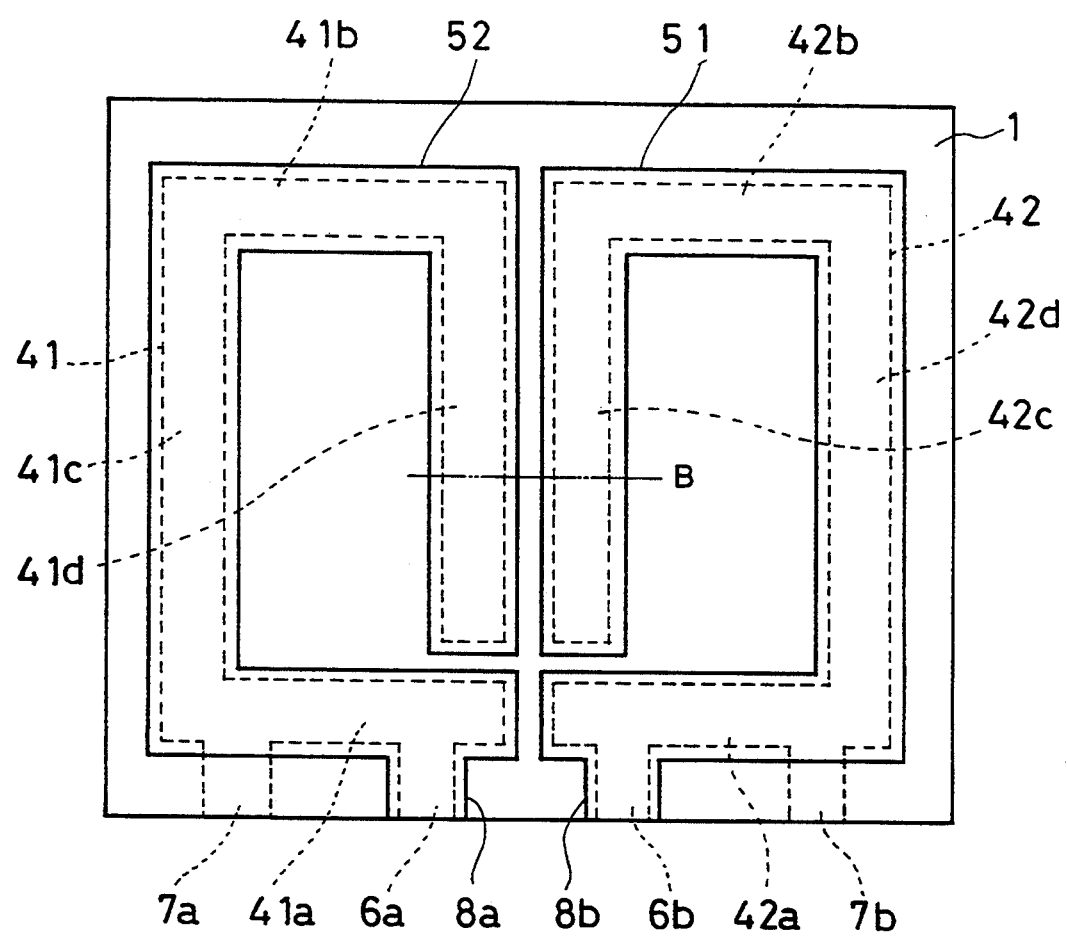
FIG. 25 is a plan view showing the band-pass filter according to the sixth example of the present invention.

A sixth example of the present invention is described in the following with reference to FIG. 24 and FIG. 25. FIG. 24 and FIG. 25 are views showing a band-pass filter according to the sixth example of the present invention, wherein FIG. 24 is an exploded perspective view and FIG. 25 is a plan view.

As shown in FIG. 24 and FIG. 25, it has the same configuration as the band-pass filter shown in FIG. 19 of the fifth example, except that the shape of one earth electrode pattern (an upper pattern in FIG. 25) is made different. Specifically, it is constructed by dividing the earth electrode pattern 5 into two respective patterns 51, 52 which have the same respective shapes as the coil electrode patterns 41, 42, but are larger in size. The earth terminal patterns 8a, 8b are respectively connected to the earth electrode patterns 51, 52.

By such a configuration, it is possible to easily adjust the frequency, because the floating capacitance can be adjusted just by cutting a portion (e.g. the portion shown by two-dot chain line B in FIG. 25) of the earth electrode patterns 51, 52 corresponding to the pattern pieces 41d, 42c.

Though the above-mentioned adjustment is also possible for the earth electrode patterns of the first example through the fifth example (formed over almost the entire dielectric plate), when the frequency is to be adjusted, the configuration of this example is preferable, because the required cut length with the earth electrode patterns of the first example to the fifth example would be long.

Moreover, the modification of the earth electrode pattern of this example is not limited to the band-pass filter having the construction shown in FIG. 18 of the fifth example, but is also applicable for those shown in the other examples.

(Seventh Example)

Figure 26:
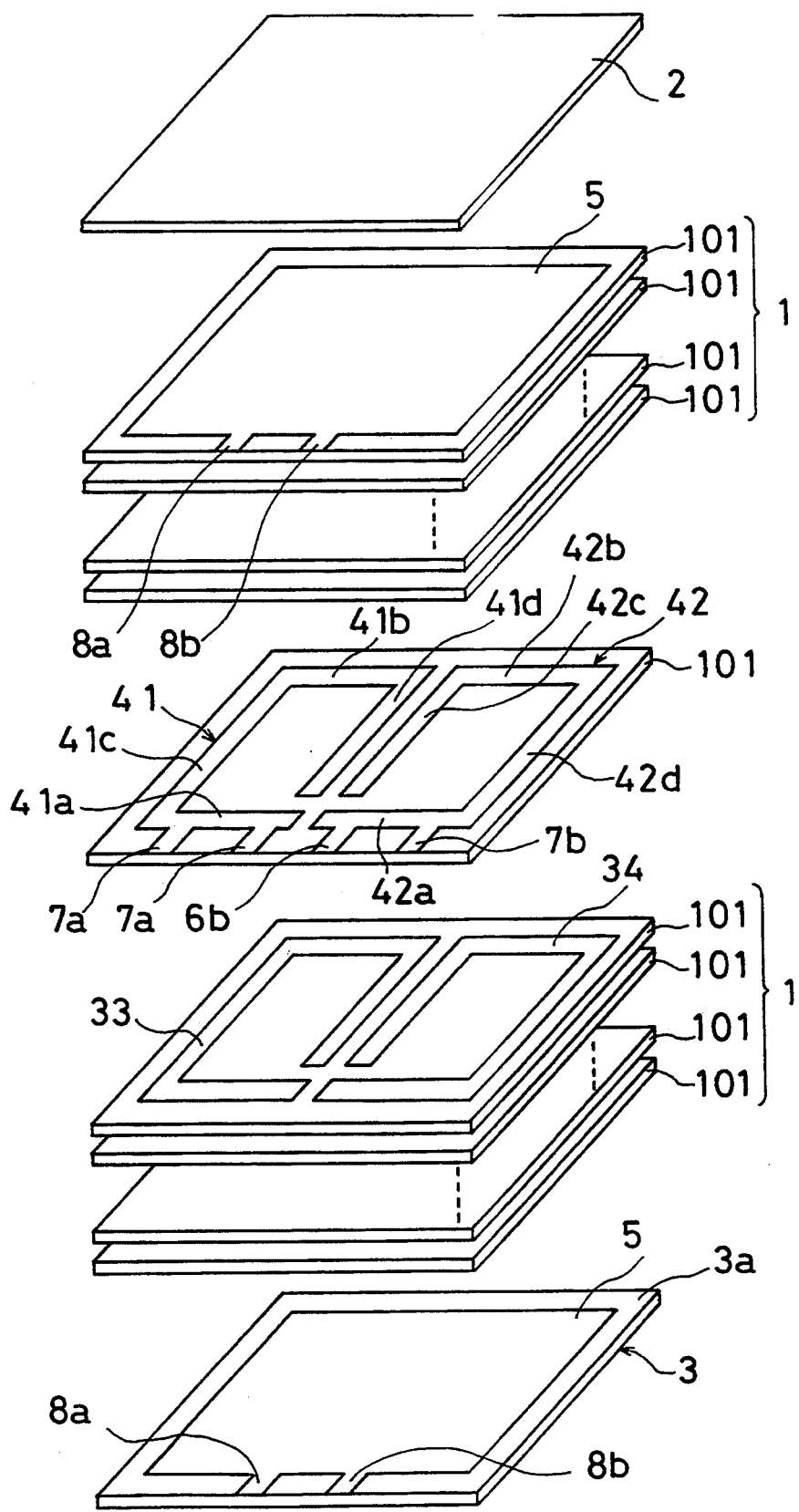
FIG. 26 is an exploded perspective view showing a band-pass filter according to a seventh example of the present invention.

A seventh example of the present invention is described in the following with reference to FIG. 26. FIG. 26 is an exploded perspective view of a band-pass filter according to the seventh example of the present invention.

As shown in FIG. 26, it has the same configuration as the band-pass filter shown in FIG. 18 of the fifth example, except that floating electrode patterns (third electrodes) 33, 34 having the same shape as the coil electrode patterns 41, 42 are formed on the dielectric sheet 101 adjacent to the dielectric sheet 101 whereon the coil electrode patterns 41, 42 are formed.

Although not shown, it has been confirmed by an experiment that by such a configuration, a peak of the passing band frequency becomes much lower than in the band-pass filter shown in FIG. 18 of the fifth example.

This is believed to an be due to increase in capacitance formed in the band-pass filter, because a floating capacitance is formed between the coil electrode patterns 41, 42 and the floating electrode patterns 33, 34.

FIG. 36 shows a modification of the seventh example of the invention (FIG. 26). In this modified example, the earth electrode pattern (second electrode) 5, which is formed on the uppermost dielectric layer 1, is formed into two sections 51, 52. Each of the sections 51, 52 has a shape similar to that of an adjacent first electrode 41 or 42, but larger. That is, the strip-shaped material of which the second electrode sections are formed has a greater width than the corresponding material strips of the first electrodes. Respective second earth terminals 8a, 8b are drawn out respectively from the second electrode sections 51, 52, toward the front edge of the dielectric plate 1 on which the second electrode sections are formed. As in the other forms of the invention, it is advantageous for the earth terminals drawn out from corresponding first and second electrodes to line up along a common edge of the dielectric plates 1 on which they are formed.

(Eighth Example)

An eighth example of the present invention is described in the following with reference to FIG. 27. FIG. 27 is an exploded perspective view of a band-pass filter according to the eighth example of the present invention.

In the band-pass filter of the eighth example, loop shaped trimming electrodes 60, 62 are formed between one earth electrode pattern (an upper pattern in FIG. 27) and the protective layer 2. The trimming electrodes 60, 62 are disposed opposite the coil electrode patterns 41, 42 with the dielectric sheet 101 and the earth electrode pattern 5 between them. Connecting terminal patterns 66a, 66b are formed respectively to the trimming electrodes 60, 62, and connected to the connecting terminal patterns 66a, 66b drawn out from the coil electrode patterns 41, 42 toward a side of the dielectric sheet 101. The connecting terminal pattern 66a of the trimming electrode 60 is connected to the connecting terminal pattern 66a of the coil electrode pattern 41 via an external connecting electrode 68a. Similarly, the connecting terminal pattern 66b of the trimming electrode 62 is connected to the connecting terminal pattern 66b of the coil electrode pattern 42 via an external connecting electrode 68b.

In the band-pass filter of the eighth example, the floating capacitance between the trimming electrodes 60, 62 and the earth electrode pattern 5 is changed by trimming the trimming electrodes 60, 62 as shown by one-dot chain line in FIG. 27, for example with a laser trimming method. This changes the passing band frequency of the band-pass filter.

The shape of the trimming electrodes 60, 62 is not limited to the loop shape, but rather may be a partial loop shape as shown in FIG. 28. In the case of using such shape, the floating capacitance is changed by trimming, which changes the passing band frequency of the band-pass filter.

(Ninth Example)

A ninth example of the present invention is described in the following with reference of FIG. 29. FIG. 30 is an exploded perspective view of a band-pass filter according to the ninth example of the present invention.

Figure 29:
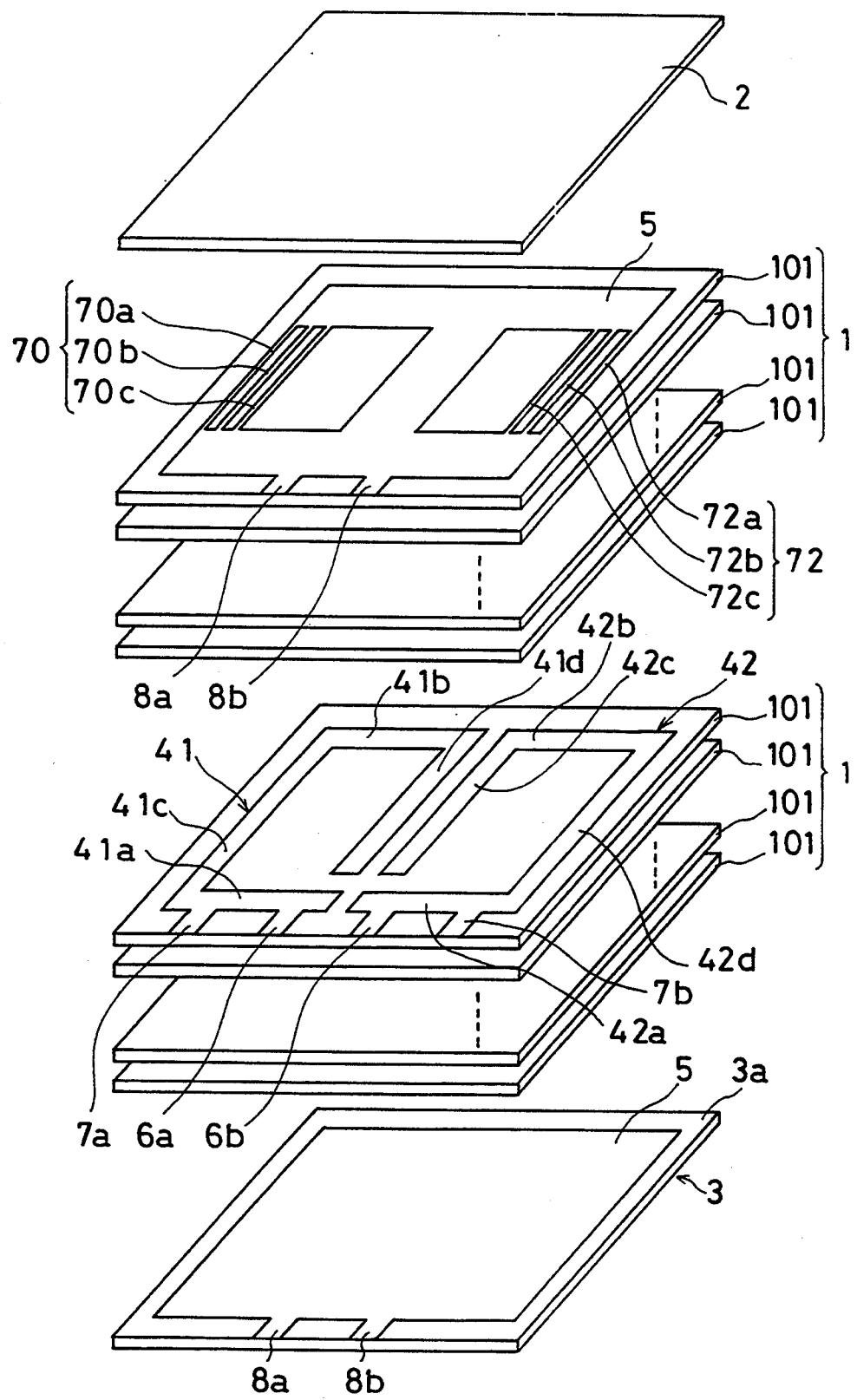
FIG. 29 is an exploded perspective view of a band-pass filter according to a ninth example of the present invention.

In the band-pass filter of the ninth example, trimming electrode groups 70, 72 are formed within one earth electrode pattern (an upper pattern in FIG. 29). The trimming electrode group 70 includes band strip shaped trimming electrodes 70a, 70b, 70c. The trimming electrodes 70a, 70b, 70c are connected to the earth electrode pattern 5. Similarly, the trimming electrode group 72 includes plural trimming electrodes 72a, 72b, 72c.

In the band-pass filter of the ninth example, the magnetic field shield effects is by cutting the trimming electrodes as shown in FIG. 30, for example with a laser trimming method. This causes to the growth of the magnetic field of each resonator, which changes the passing band frequency of the band-pass filter. In this case, the changing rate of the passing band frequency can be adjusted by changing the number of the trimming electrodes that are cut.

(Other respects)

Figure 31:
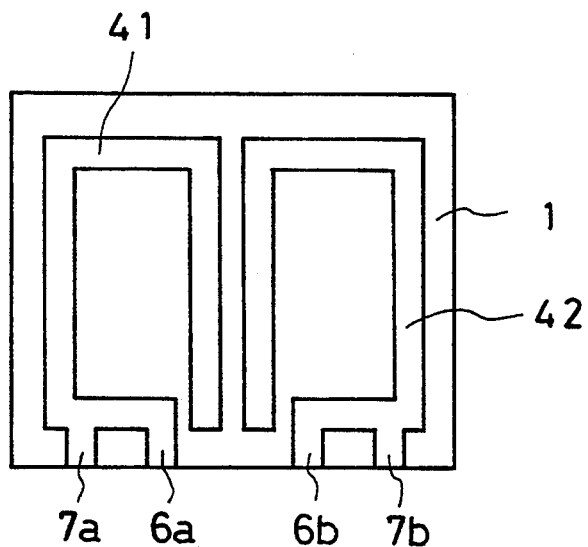
FIG. 31 is a plan view of essential portions showing a modified example of a band-pass filter of the present invention.
Figure 32:
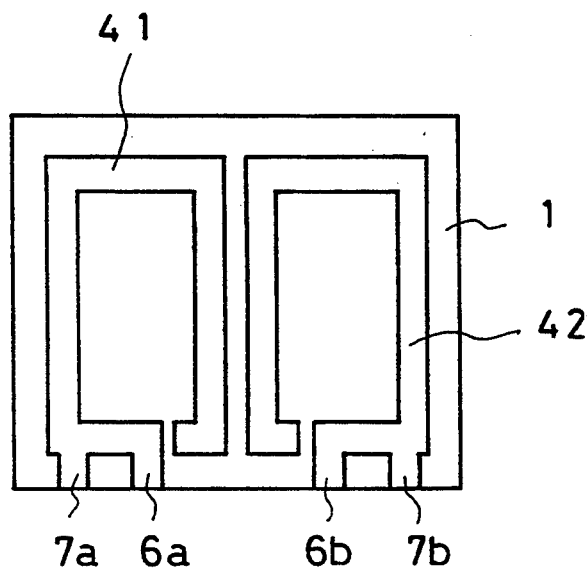
FIG. 32 is a plan view of essential portions showing another modified example of a band-pass filter of the present invention.
Figure 33:
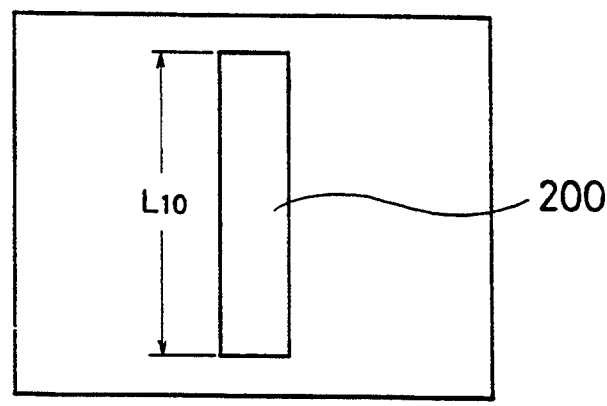
FIG. 33 is an explanatory view showing an example of a conventional strip-line type dielectric resonator.
Figure 34:
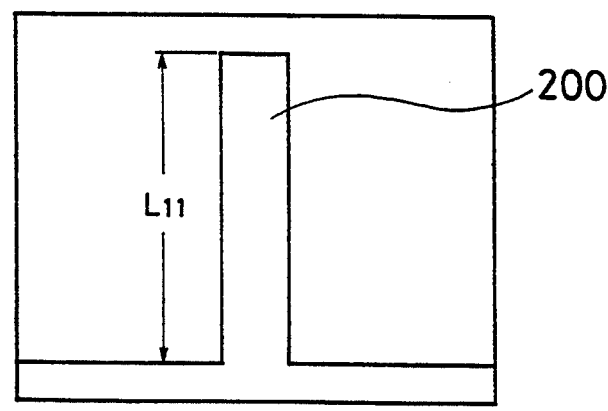
FIG. 34 is an explanatory view showing another example of a conventional strip-line type dielectric resonator.
Figure 35:
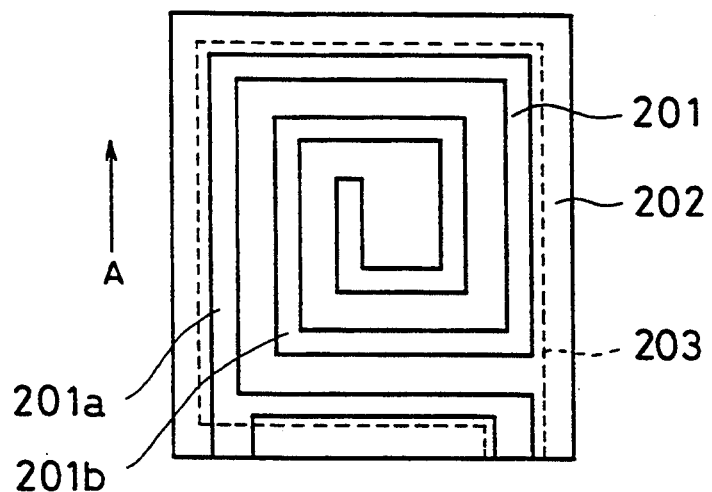
FIG. 35 is an explanatory view showing an example of a conventional coil-pattern type dielectric resonator.

The construction of the coil electrode patterns 41, 42, is not limited to those shown in the above-mentioned various examples. For example, they may have a loop shape as shown in FIG. 31 and FIG. 32.

As described heretofore, according to the present invention, because it has a so-called strip-line construction and because pattern pieces of the first electrodes are not adjacent to each other, it is possible to improve the Q remarkably. As a result, the insertion loss of the band-pass filter is reduced and its skirt characteristic is improved.

Moreover, since the first electrodes are looped, the size of the elements becomes smaller. In addition, it is very easy to adjust the impedance, because it can be adjusted just by changing a distance between the input/output terminal and the earth terminal of one or both of the first electrodes.

Additionally, the passing band frequency of the passband filter can be adjusted by trimming the trimming electrodes which are formed the earth electrode patterns or connected to the coil electrode patterns. A predetermined passing band frequency can thus be obtained by adjusting the band-pass filter if its passing band frequency is initially shifted from that predetermined value. Accordingly, the production of inferior products can be reduced.

In these respects, the invention has the effect of providing a very excellent small-sized band-pass filter whose insertion loss is small and whose input/output impedances and passing band frequency can be adjusted optionally.

It will be apparent from the foregoing that, while the present invention has been described in detail and illustrated, these are only particular illustrations and examples and the invention is not limited to those shown. The spirit and scope of the invention is limited only by the appended claims.

What is claimed is:

1. A band-pass filter comprising:
    two first electrodes formed in a non-spiral loop shape and disposed so as to be magnetically coupled with each other;
    a second electrode formed in a plane shape opposite said first electrodes;
    a plate comprising a dielectric material between said first electrodes and said second electrode;
    two earth terminals drawn out respectively from said two first electrodes toward an edge portion of said plate;
    two input/output terminals drawn out respectively from said two first electrodes toward the same said edge portion of said plate with a distance between said earth terminals and said input/output terminals providing a predetermined impedance; and
    a pair of second earth terminals drawn out from said second electrode toward the same said edge portion of said plate.

2. A band-pass filter according to claim 1, wherein an additional second electrode is formed on the opposite side of said first electrodes from the first-mentioned second electrode and an additional plate comprising a dielectric material is disposed between said first electrodes and said additional second electrode.

3. A band-pass filter according to claim 2, wherein said additional second electrode is divided into two sections having substantially the same shape which is larger than that of said first electrodes, and a further pair of second earth terminals are drawn out respectively from the two electrode sections toward the same said edge portion of said plates.

4. A band-pass filter according to claim 2, wherein between said first electrodes and at least one of said second electrodes, a pair of third electrodes having substantially the same loop shape as said first electrodes are formed.

5. A band-pass filter according to claim 3, wherein a further additional plate comprising dielectric material is disposed between said first electrodes and one of said second electrodes, and a pair of third electrodes having substantially the same loop shape as said first electrodes are formed on said further additional plate.

6. A band-pass filter according to claim 2, wherein a pair of trimming electrodes are formed in a loop shape and spaced a distance from one of said second electrodes on the opposite side of said one of said second electrodes from said first electrodes, with a plate comprising a dielectric material disposed between said trimming electrodes and said one of said second electrodes, and said trimming electrodes are connected respectively to said first electrodes.

7. A band-pass filter according to claim 2, wherein a plurality of strip-shaped trimming electrodes are formed within at least one of said second electrodes, and are connected to said at least one of said second electrodes.

8. A band-pass filter according to claim 1, wherein each of said first electrodes has a gap formed therein.

9. A band-pass filter according to claim 1, wherein each of said first electrodes is continuous, having no gap formed therein.

10. A band-pass filter according to claim 2, wherein each of said first electrodes has a gap formed therein.

11. A band-pass filter according to claim 2, wherein each of said first electrodes is continuous, having no gap formed therein.

12. A band-pass filter according to claim 6, wherein said trimming electrodes are formed in a closed loop shape.

13. A band-pass filter according to claim 6, wherein said trimming electrodes are formed in a partial loop shape.

14. A band-pass filter according to claim 7, wherein said strip-shaped trimming electrodes are defined by respective elongated cut-outs formed within said at least one of second electrodes.

15. A band-pass filter comprising:
   two first electrodes formed in a non-spiral loop shape and disposed so as to be magnetically coupled with each other;
   a second electrode formed in a plane shape opposite said first electrodes;
   a plate comprising a dielectric material and having a periphery being disposed between said first electrodes and said second electrode;
   two earth terminals drawn out respectively from said two first electrodes toward the periphery of said plate;
   two input/output terminals drawn out respectively from said two first electrodes toward the periphery of said plate, a distance along said periphery between said earth terminals and said input/output terminals providing a predetermined impedance; and
   a pair of second earth terminals drawn out from said second electrode toward said periphery of said plate.

* * * * *